US012751329B2

(12) United States Patent
Check et al.

(10) Patent No.: US 12,751,329 B2
(45) Date of Patent: Sep. 29, 2026

(54) EDGE-EMITTING SEMICONDUCTOR DEVICES AND RELATED METHODS

(71) Applicant: CreeLED, Inc., Durham, NC (US)

(72) Inventors: Michael Check, Holly Springs, NC (US); David Suich, Durham, NC (US); Colin Blakely, Raleigh, NC (US); Andre Pertuit, Raleigh, NC (US); Joseph G. Sokol, Durham, NC (US); Robert Wilcox, Rolesville, NC (US)

(73) Assignee: CreeLED, Inc., Durham, NC (US)

( * ) Notice: Subject to any disclaimer, the term of this patent is extended or adjusted under 35 U.S.C. 154(b) by 423 days.

(21) Appl. No.: 18/345,166

(22) Filed: Jun. 30, 2023

(65) Prior Publication Data

US 2025/0006709 A1 Jan. 2, 2025

(51) Int. Cl.

*H10W 90/00* (2026.01)
*H10H 20/01* (2025.01)
*H10H 20/854* (2025.01)
*H10H 20/857* (2025.01)

(52) U.S. Cl.

CPC .......... *H10W 90/00* (2026.01); *H10H 20/018* (2025.01); *H10H 20/854* (2025.01); *H10H 20/857* (2025.01); *H10H 20/0362* (2025.01); *H10H 20/0364* (2025.01)

(58) Field of Classification Search

CPC ... H10W 90/00; H10H 20/018; H10H 20/854; H10H 20/857; H10H 20/0362; H10H 20/0364; H10H 20/019; H10H 20/021; H10H 29/0362; H10H 29/14; H10H 29/852; H10H 29/24

See application file for complete search history.

(56) References Cited

U.S. PATENT DOCUMENTS 6,018,167 A * 1/2000 Oota .................. H10H 20/8506 257/79
8,455,882 B2 6/2013 Yao
10,290,777 B2 * 5/2019 Andrews ............ H10H 20/8515
2003/0122136 A1 * 7/2003 Oshima ................ H01S 5/0281 257/79
2006/0214171 A1 * 9/2006 Saito .................. H10H 20/8314 257/79

(Continued)

FOREIGN PATENT DOCUMENTS

CN 104143598 * 11/2014 ........................ 33/38
CN 107680960 A 2/2018
CN 114388483 A 4/2022

*Primary Examiner* — Victor A Mandala

(74) *Attorney, Agent, or Firm* — Withrow & Terranova, P.L.L.C.

(57) ABSTRACT

Semiconductor devices and more particularly edge-emitting semiconductor devices and related methods are disclosed. Exemplary edge-emitting semiconductor devices include LED edge emitters. Electrical connections for edge-emitting devices may be provided along certain device edges with opposing edges forming light-emitting edges. LED edge emitters may be vertically arranged and assembled together to form LED arrays with reduced pitch. Related methods include bonding multiple wafer-level structures, such as LED wafers, together, followed by separation techniques that result in individual edge emitters or groupings of edge emitters in the form of LED arrays.

24 Claims, 14 Drawing Sheets

(56) References Cited

U.S. PATENT DOCUMENTS

| | | | | |
|---|---|---|---|---|
| 2008/0101062 | A1* | 5/2008 | Feng | H10H 20/8506 257/E33.072 |
| 2009/0296389 | A1* | 12/2009 | Hsu | H10H 20/841 257/98 |
| 2010/0032703 | A1 | 2/2010 | Miller et al. | |
| 2012/0153334 | A1 | 6/2012 | Park et al. | |
| 2014/0264405 | A1* | 9/2014 | Brindisi | H10K 59/90 257/89 |
| 2019/0319168 | A1* | 10/2019 | Kim | H10W 90/00 |
| 2021/0005590 | A1* | 1/2021 | Ishii | H10W 90/00 |
| 2021/0082885 | A1* | 3/2021 | Ishii | H10W 90/00 |
| 2022/0052229 | A1* | 2/2022 | Min | H10H 20/8506 |
| 2022/0059610 | A1 | 2/2022 | Lin et al. | |
| 2022/0173267 | A1* | 6/2022 | Teo | H10H 20/01335 |
| 2022/0367765 | A1 | 11/2022 | Lee et al. | |
| 2025/0056933 | A1* | 2/2025 | Suich | H10H 20/8506 |

* cited by examiner

EDGE-EMITTING SEMICONDUCTOR DEVICES AND RELATED METHODS

FIELD OF THE DISCLOSURE

The present disclosure relates to semiconductor devices and more particularly to edge-emitting semiconductor devices and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have been widely adopted in various illumination contexts, for backlighting of liquid crystal display (LCD) systems (e.g., as a substitute for cold cathode fluorescent lamps), and for direct-view LED displays. Applications utilizing LED arrays further include vehicular headlamps, roadway illumination, light fixtures, and various indoor, outdoor, and specialty contexts. Desirable characteristics of LED devices include high luminous efficacy, long lifetime, and color gamut.

LEDs convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. Multiple color LED packages have been developed that include LED chips with different emission colors arranged within a same package structure. In certain applications, the LED chips can be arranged in close proximity to one another on a common submount, which can add complexity for corresponding electrical connections. As LED applications continue to advance, challenges exist in producing high quality light with desired emission characteristics while also providing high light emission efficiency.

The art continues to seek improved LEDs and solid-state lighting devices having desirable illumination characteristics capable of overcoming challenges associated with conventional lighting devices.

SUMMARY

The present disclosure relates to semiconductor devices and more particularly to edge-emitting semiconductor devices and related methods. Exemplary edge-emitting semiconductor devices include light-emitting diode (LED) edge emitters. Electrical connections for edge-emitting devices may be provided along certain device edges with opposing edges forming light-emitting edges. LED edge emitters may be vertically arranged and assembled together to form LED arrays with reduced pitch. Related methods include bonding multiple wafer-level structures, such as LED wafers, together, followed by separation techniques that result in individual edge emitters or groupings of edge emitters in the form of LED arrays.

In one aspect, an LED array comprises: an encapsulation layer; and a plurality of LED chips in the encapsulation layer, each LED chip of the plurality of LED chips comprising an active layer that extends in a perpendicular direction between a first face of the encapsulation layer and a second face of the encapsulation layer. In certain embodiments, a first edge of each LED chip of the plurality of LED chips is proximate the first face of the encapsulation layer relative to the second face of the encapsulation layer. In certain embodiments: electrical connections for the plurality of LED chips are electrically coupled to the first edge of each LED chip of the plurality of LED chips; and a second edge of each LED chip of the plurality of LED chips is positioned proximate the second face of the encapsulation layer relative to the first face of the encapsulation layer. In certain embodiments, the second edge of each LED chip of the plurality of LED chips forms a plurality of light-emitting edges for the plurality of LED chips. The LED chip may further comprise a lumiphoric material on the first face of the encapsulation layer, the lumiphoric material being registered with the second edge of at least one LED chip of the plurality of LED chips. In certain embodiments, the first edge of each LED chip of the plurality of LED chips is coplanar with the first face of the encapsulation layer. In certain embodiments, the electrical connections comprise n-contact pads and p-contact pads on the first face of the encapsulation layer.

The LED array may further comprise: an additional encapsulation layer on the first face of the encapsulation layer, wherein the n-contact pads and the p-contact pads extend through the additional encapsulation layer; and a plurality of additional contact pads on the additional encapsulation layer, wherein certain ones of the plurality of additional contact pads are electrically coupled to the certain ones of the n-contact pads or the p-contact pads. In certain embodiments, the plurality of additional contact pads comprise a larger surface area than the n-contact pads and the p-contact pads. In certain embodiments, a single additional contact pad of the plurality of additional contact pads is connected to multiple ones of either the n-contact pads or the p-contact pads.

In certain embodiments, a pitch between adjacent LED chips of the plurality of LED chips is in a range from 10 nanometers (nm) to 1000 nm. In certain embodiments, the plurality of LED chips comprises subgroupings of LED chips bonded together to form LED devices that are spaced apart within the encapsulation layer. In certain embodiments, the LED chips within each of the subgroupings of LED chips are electrically connected in series.

In another aspect, an LED device comprises: a first active LED structure comprising a first n-type layer, a first active layer, and a first p-type layer, the first active LED structure forming a first edge that includes portions of the first n-type layer and the first p-type layer; a first n-contact pad electrically coupled to the first n-type layer at the first edge; and a first p-contact pad electrically coupled to the first p-type layer at the first edge. In certain embodiments, the first active LED structure forms a second edge that is opposite the first edge, and the first active layer extends between the first edge and the second edge. The LED device may further comprise: a first n-contact layer on the first n-type layer; and a first p-contact layer on the first p-type layer, the first n-contact layer and the first p-contact layer both extending to the first edge on opposing sides of the first active LED structure. The LED device may further comprise a second active LED structure with a second n-type layer, a second active layer, and a second p-type layer, the second active LED structure being arranged relative to the first active LED structure such that the first edge includes portions of the second n-type layer and the second p-type layer. The LED device may further comprise: a second n-contact layer on second n-type layer; and a second p-contact layer on the second p-type layer, wherein the first p-contact layer and the second n-contact layer are between the first active LED structure and the second active LED structure. In certain embodiments, the first active LED structure and the second active LED structure are electrically coupled in series. The LED device may further comprise a wavelength conversion element between the first n-contact layer and the first p-contact layer. The LED device may further comprise one or more electrically conductive vias that extend through the wavelength conversion element.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
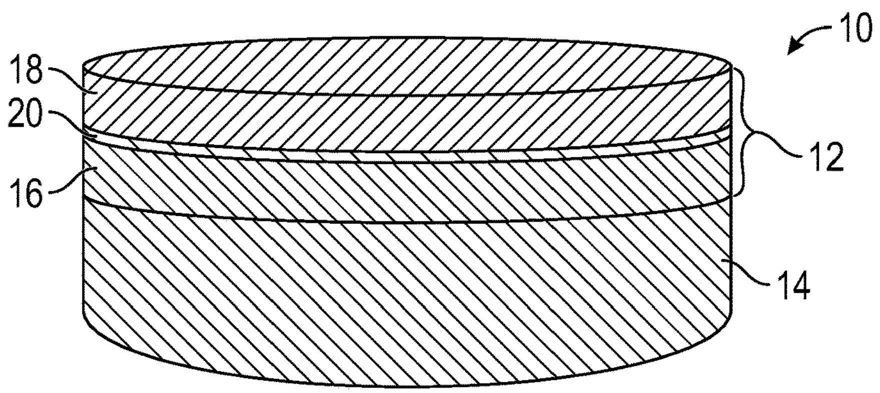
FIG. 1A is perspective view of a wafer at a fabrication step after an active light-emitting diode (LED) structure is formed on a growth substrate for a precursor fabrication sequence for forming edge-emitting semiconductor devices.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to semiconductor devices and more particularly to edge-emitting semiconductor devices and related methods. Exemplary edge-emitting semiconductor devices include light-emitting diode (LED) edge emitters. Electrical connections for edge-emitting devices may be provided along certain device edges with opposing edges forming light-emitting edges. LED edge emitters may be vertically arranged and assembled together to form LED arrays with reduced pitch. Related methods include bonding multiple wafer-level structures, such as LED wafers, together, followed by separation techniques that result in individual edge emitters or groupings of edge emitters in the form of LED arrays.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include organic semiconductor materials and other Group III-V systems such as gallium phosphide (GaP), gallium arsenide (GaAs), and related compounds. The active LED structure may be grown on a growth substrate that can include many materials, such as sapphire, silicon carbide (SiC), aluminum nitride (AlN), and GaN.

Different embodiments of the active LED structure can emit different wavelengths of light depending on the composition of the active layer and n-type and p-type layers. In some embodiments, the active LED structure emits blue light with a peak wavelength range in a range of 430 nanometers (nm) to 480 nm. In other embodiments, the active LED structure emits green light with a peak wavelength in a range of 500 nm to 570 nm. In other embodiments, the active LED structure emits orange and/or red light with a peak wavelength range of 600 nm to 700 nm. In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 700 nm to 1000 nm, or more.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

According to aspects of the present disclosure, LED structures may be incorporated within packages that may include one or more elements, such as lumiphoric materials, encapsulants, light-altering materials, lens, and electrical contacts, among others, that are provided with one or more LED chips. In certain aspects, packages may include a support member, such as a submount or a lead frame. Light-altering materials may be arranged within packages to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects light-reflective particles may also be referred to as light-scattering particles. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder.

In LED display applications, LED chips are typically individually addressable to provide color-changing, dynamic spectral tuning, and the like. When LED chips having different emission wavelengths are arranged in close proximity to one another, practical limitations exist for packaging the LED chips, providing electrical connections, and/or thermal management. Conventional devices for such applications may include separately packaged LED components that are clustered together, where each separately packaged LED component may include a single LED chip or a grouping of different LED chips. However, each separately packaged LED component typically includes its own submount and encapsulant, thereby providing spatial limitations in how close the separately packaged LED components may be arranged together.

Aspects of the present disclosure relate to edge-emitting semiconductor devices, such as LED chips in the form of LED edge emitters. For such edge-emitting devices, electrical connections may be provided along sidewalls or device edges. In this manner, a first edge of the semiconductor device may be configured to be mounted to another surface such that emissions are directed out of an opposite edge. In the context of LED chips, an edge-emitting LED may be configured such that p-type and n-type electrical connections are provided at a first edge of the active LED structure. The first edge may then be mounted to another surface such that a second edge that is distal to the mounting surface and forms a primary emission surface. In such embodiments, a plane corresponding to the active layer of the LED may be mounted on its edge, such as generally perpendicular to the mounting surface.

In this regard, the edge-emitting LEDs may be arranged in close proximity to one another with a pitch not possible by conventional means. In certain embodiments, LED chips as LED edge emitters are capable of being arranged with a super fine pitch within an LED array. For example, a pitch, or spacing between next-adjacent LED chips may be as low as 10 nm, or in a range from 10 nm to 1000 nm with tolerances of + or −10%. Such fine pitch capabilities are well suited for providing LED chips as pixels of LED displays with increased resolution.

Methods of manufacturing such edge-emitting semiconductor devices involve forming device and contact layers at a wafer level, rotating the wafer level structure, and performing singulation from the perspective of edges of the device and contact layers. In certain aspects, multiple wafer level structures with different types of semiconductor layers may be separately formed and joined together before singulation from wafer edges. In this manner, singulated edge-emitting devices may include portions of each of the different types of semiconductor layers. In the context of LED devices, multiple wafers of active LED structures, such as red, blue, and green structures, may be joined together such that corresponding edge-emitting devices are capable of emitting red, blue and green light after singulation. Embodiments of the present disclosure are discussed in the context of LEDs; however, the principles described are also applicable to other devices, such as lasers or other semiconductor devices. Emission wavelengths for such edge-emitting semiconductor devices include various wavelengths across the electromagnetic spectrum, including visible light, infrared, and ultraviolet emissions.

FIGS. 1A to 1F are perspective views of a wafer 10 during various fabrication steps for forming exemplary edge-emitting semiconductor devices.

FIG. 1A is perspective view of the wafer 10 at a fabrication step after an active LED structure 12 is formed on a growth substrate 14. The active LED structure 12 may be epitaxially grown on the growth substrate 14 as a sequence of epitaxial layers. For illustrative purposes, an n-type layer 16, a p-type layer 18, and an active layer 20 therebetween are illustrated. As described above, it is understood an active LED structure 12 may include many additional layers.

Figure 1B:
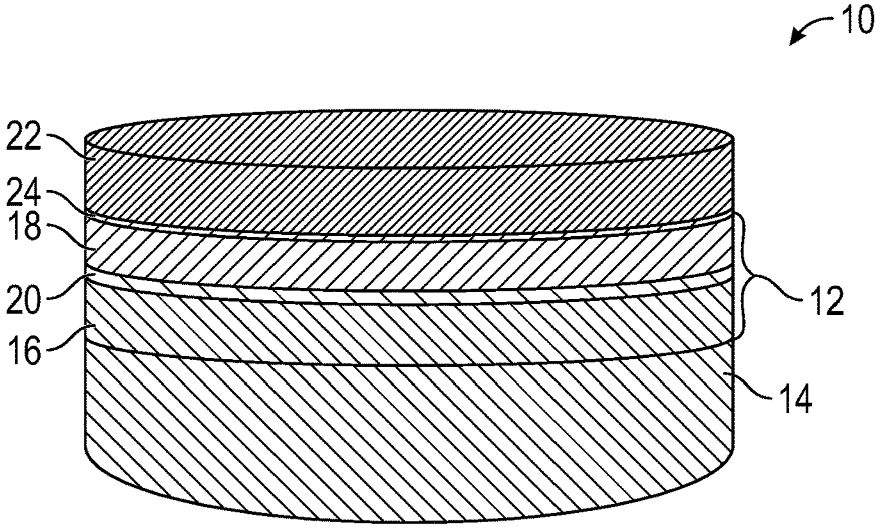
FIG. 1B is a perspective view of the wafer of FIG. 1A at a subsequent fabrication step after a p-contact has been fabricated on a p-type layer of the active LED structure.

FIG. 1B is a perspective view of the wafer 10 of FIG. 1A at a subsequent fabrication after a p-contact 22 has been fabricated on the p-type layer 18. As used herein, the p-contact 22 may also be referred to as a p-contact layer. As illustrated, the p-contact 22 may be blanket deposited to cover substantially all of the p-type layer 18 in certain embodiments. The p-contact 22 may include many different materials such as gold (Au), copper (Cu), nickel (Ni), In, Al, Ag, tin (Sn), platinum (Pt), chromium (Cr) or alloys or combinations thereof. In still other embodiments, the p-contact 22 may comprise electrically conducting oxides and transparent conducting oxides such as indium tin oxide (ITO), nickel oxide (NiO), zinc oxide (ZnO), cadmium tin oxide, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, LaCuOS, $CuGaO_2$, and $SrCu_2O_2$. The p-contact 22 may embody a multiple layer structure with multiple layers of any of the materials described above. In certain embodiments, a current spreading layer 24 may optionally be applied after the active LED structure 12 is formed and before the p-contact 22 is formed. The current spreading layer 24 may embody a layer of conductive material, for example a transparent conductive oxide such as ITO or a metal such as Pt, although other materials may be used.

Figure 1C:
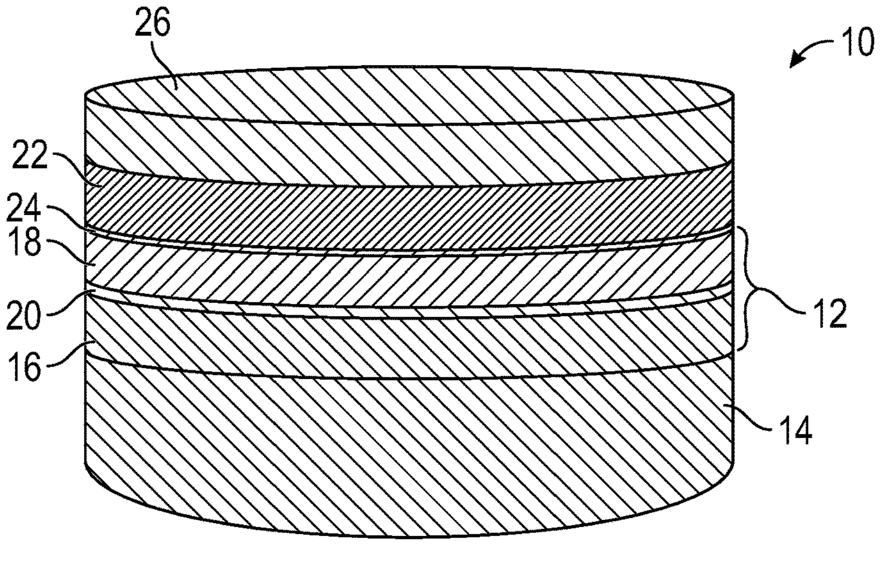
FIG. 1C is a perspective view of the wafer of FIG. 1B at a subsequent fabrication step where a temporary carrier is bonded to the p-contact.

FIG. 1C is a perspective view of the wafer 10 of FIG. 1B at a subsequent fabrication step where a temporary carrier 26 is bonded to the p-contact 22. The temporary carrier 26 may be any material capable of providing structural support during later-described steps of removing the growth substrate 14. By way of example, the temporary carrier 26 may comprise a wafer of Si or sapphire. The temporary carrier 26 may be adhered to the p-contact 22 by way of a temporary bond, such as adhesive and/or wax, or by way of a more permanent bond, such as epoxy or benzocyclobutene (BCB), among others.

Figure 1D:
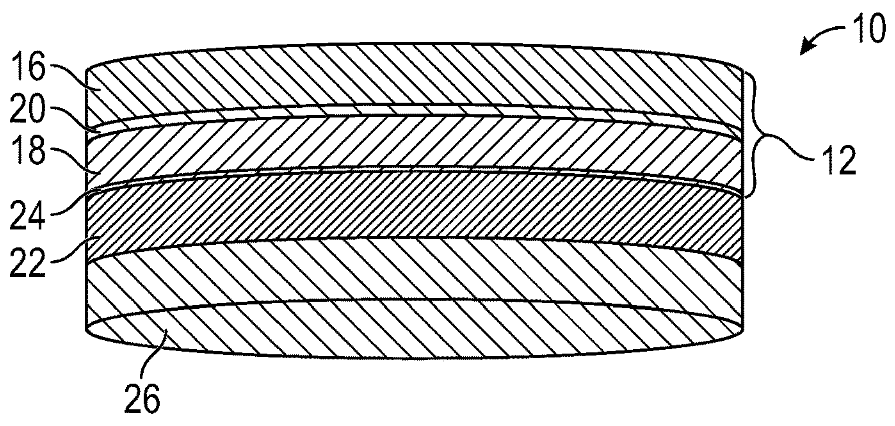
FIG. 1D is a perspective view of the wafer of FIG. 1C at a subsequent fabrication step after the growth substrate for the active LED structure of FIG. 1C is removed.

FIG. 1D is a perspective view of the wafer 10 of FIG. 1C at a subsequent fabrication step after the growth substrate 14 of FIG. 1C is removed. The growth substrate 14 may be removed by various techniques, with laser liftoff being a suitable option. As illustrated, a surface of the n-type layer 16 is exposed after the growth substrate 14 is removed. In certain embodiments, a cleaning step may be performed on the surface of the n-type layer 16 to remove any residue left over from removal of the growth substrate 14. In certain embodiments, the cleaning step may comprise application of dilute hydrochloric acid (HCL), among others, to the n-type layer 16 In FIG. 1D, the orientation of the wafer 10 is inverted from previous figures to illustrate processing of the wafer 10 from above.

Figure 1E:
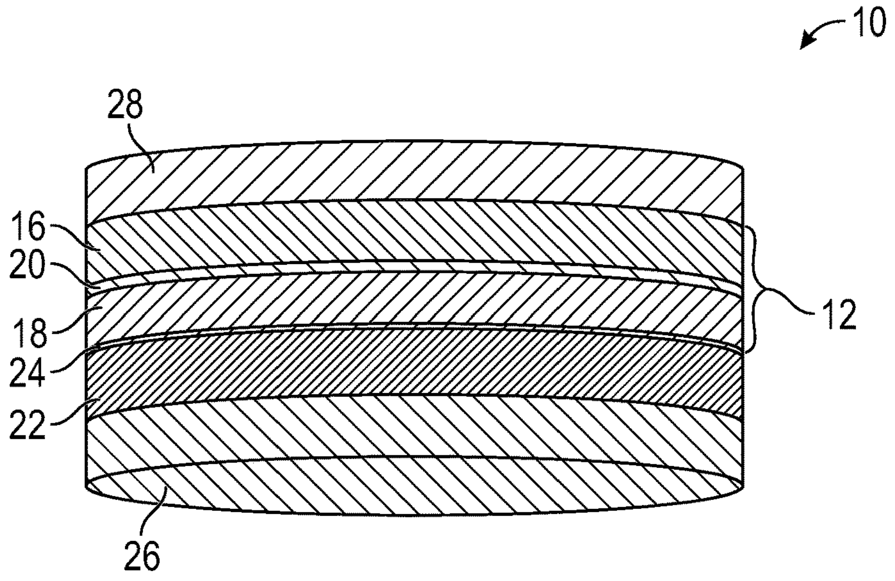
FIG. 1E is a perspective view of the wafer of FIG. 1D at a subsequent fabrication step after an n-contact has been fabricated on a n-type layer of the active LED structure.

FIG. 1E is a perspective view of the wafer 10 of FIG. 1D at a subsequent fabrication step after an n-contact 28 has been fabricated on the n-type layer 16. As used herein, the n-contact 28 may also be referred to as an n-contact layer. As illustrated, the n-contact 28 may be blanket deposited to cover substantially all of the n-type layer 16 in certain embodiments. The n-contact 28 may include a single layer or a multiple layer stack of any of the same materials described above for the p-contact 22. In certain embodiments, the n-contact 28 may be formed with a sufficient thickness to provide mechanical support for the active LED structure 12 so the temporary carrier 26 may later be removed. In this regard, the n-contact 28 may be configured to balance stress within the active LED structure 12 and thereby reduce bowing, particularly after removal of the temporary carrier 26. By way of example, the n-contact 28 may include a multiple layer stack where a thickest layer is formed of Ni to provide such stress balancing.

Figure 1F:
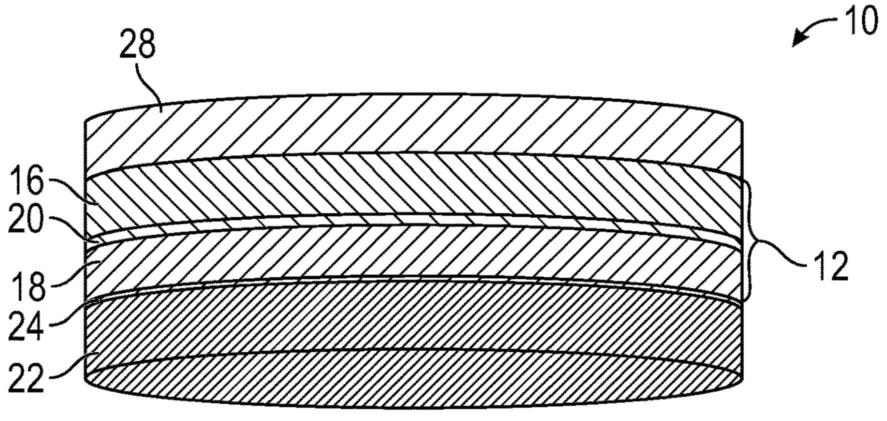
FIG. 1F is a perspective view of the wafer of FIG. 1E at a subsequent fabrication step after the temporary carrier is removed.

FIG. 1F is a perspective view of the wafer 10 of FIG. 1E at a subsequent fabrication step after the temporary carrier 26 is removed. For temporary bonding embodiments, the temporary carrier 26 may be de-bonded by dissolving the adhesive and/or wax. For permanent bonding embodiments, the temporary carrier 26 may be removed by mechanical techniques, such as grinding. After removal of the temporary carrier 26, the wafer 10 includes the active LED structure 12 sandwiched between the n-contact 28 and the p-contact 22. In this configuration, light generated by the active LED structure 12 may be internally reflected by the n-contact 28 and the p-contact 22 and directed through edges of the active LED structure 12.

FIGS. 2A to 2E illustrate views of a fabrication sequence for forming an edge-emitting semiconductor device from a wafer structure 30 formed by joining together multiple ones of the wafer 10 as illustrated in FIGS. 1A to 1F. In FIGS. 2A to 2E, the multiple wafers are labeled as wafers 10-1 to 10-3. In certain embodiments, the active LED structures of each of the wafers 10-1 to 10-3 may be configured to generate light of different peak wavelengths, such as blue, red, and green, respectively. In other embodiments, the principles described are applicable to embodiments where the active LED structures of each of the wafers 10-1 to 10-3 generate the same or similar peak wavelengths, such as all blue, or all green, or all red. Each of the wafers 10-1 to 10-3 are illustrated with corresponding ones of the n-type layer 16-1 to 16-3, the p-type layer 18-1 to 18-3, the p-contact 22-1 to 22-3, and the n-contact 28-1 to 28-3. For illustrative purposes, the active layer 20 and current spreading layer 24 of FIGS. 1A to 1F are omitted from FIGS. 2A to 2E. It is understood each of the wafers 10-1 to 10-3 have a corresponding active layer and optionally a corresponding current spreading layer.

Figure 2A:
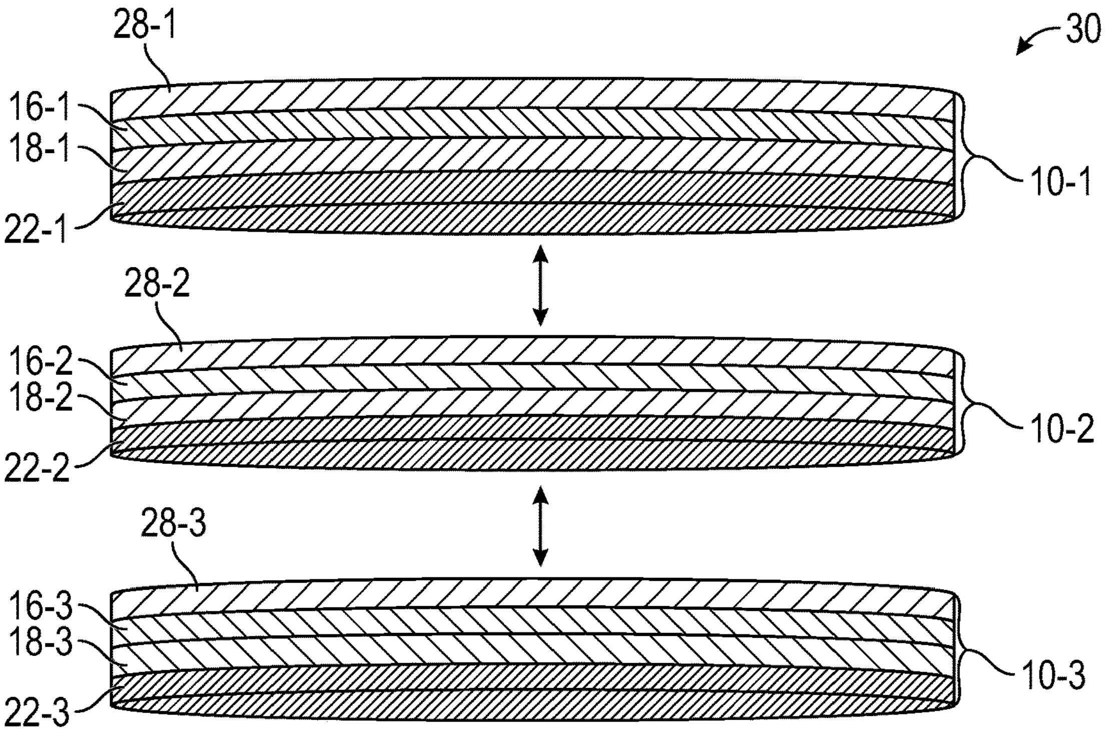
FIG. 2A is a perspective view at a fabrication step for a wafer structure where multiple wafers similar to the wafer of FIG. 1F are joined together for a fabrication sequence for forming edge-emitting semiconductor devices.
Figure 2B:
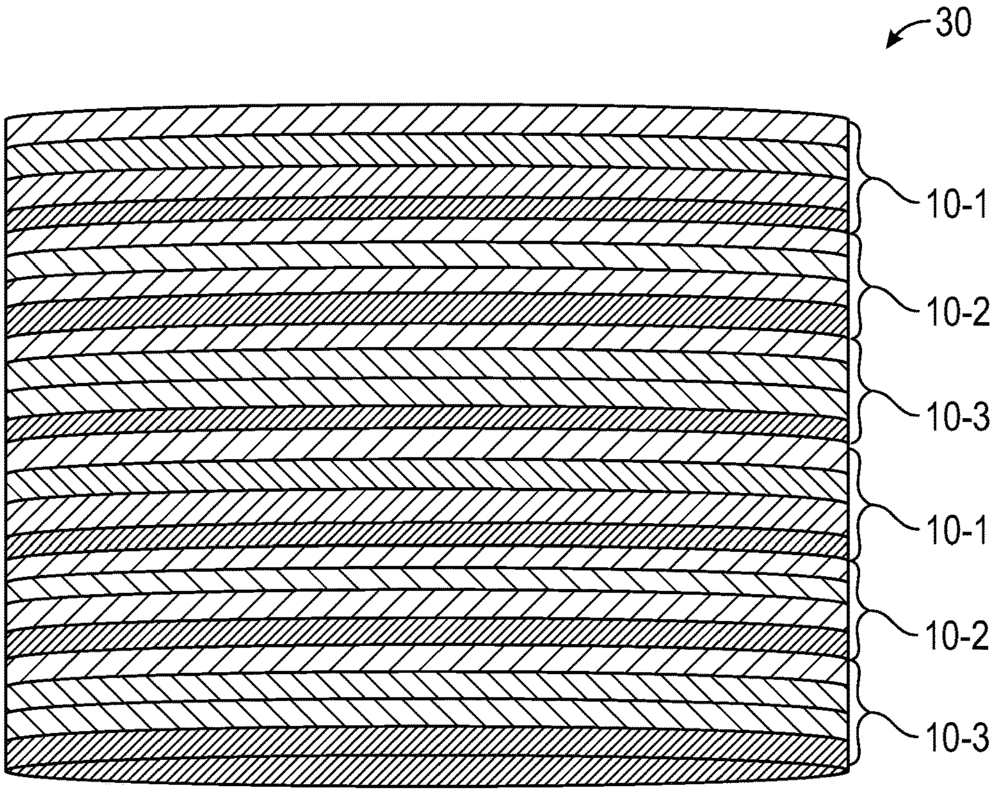
FIG. 2B is a perspective view of the wafer structure of FIG. 2A at a subsequent fabrication step after the wafers are joined together.

FIG. 2A is a perspective view at a fabrication step for the wafer structure 30 before the wafers 10-1 to 10-3 are joined together. FIG. 2B is a perspective view of the wafer structure 30 of FIG. 2A at a fabrication step after the wafers 10-1 to 10-3 are joined together. The wafers 10-1 to 10-3 may be joined by temporary bonding materials, such as glue and/or wax materials, or by way of more permanent bonding, such as epoxy, BCB, and/or oxide-oxide bonding. In certain embodiments, the bonding materials may provide electrical isolation between the wafers 10-1 to 10-3 or a separate insulator material may be provided between each of the wafers 10-1 to 10-3.

In FIG. 2B, two each of the wafers 10-1 to 10-3 are bonded together in alternating fashion to form the wafer structure 30. For multiple color applications, such a structure may sequentially position different colored emission regions in an alternating manner. For red-green-blue applications, such as pixels in LED displays, the wafers 10-1 may be configured to provide blue peak wavelengths, the wafers 10-2 may be configured to provide red peak wavelengths, and the wafers 10-3 may be configured to provide green peak wavelengths. While six total wafers 10-1 to 10-3 are joined together in the example of FIG. 2B, the principles described are applicable to any number wafers. As illustrated, the active LED structures for each of the wafers 10-1 to 10-3 are generally parallel with one another in the wafer structure 30.

Figure 2C:
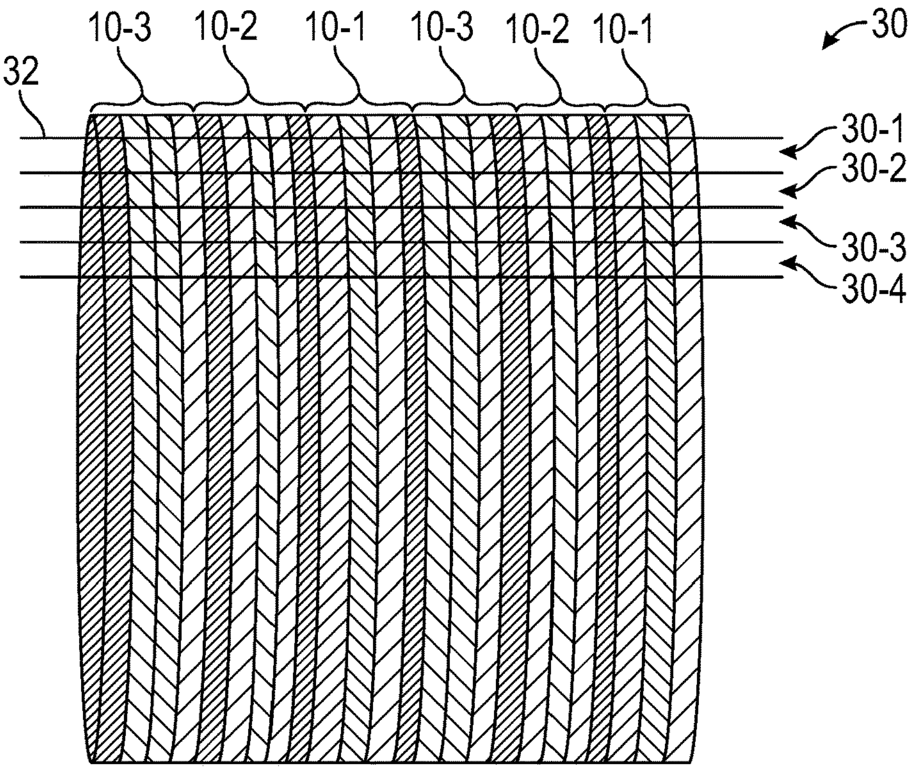
FIG. 2C is a perspective view of the wafer structure of FIG. 2B at a subsequent fabrication step where the wafer structure is subjected to a first cutting process that traverses along first cut lines through each of the wafers.

FIG. 2C is a perspective view of the wafer structure 30 of FIG. 2B at a fabrication step where the wafer structure 30 is subjected to a first cutting process that traverses along first cut lines 32 through each of the wafers 10-1 to 10-3. In certain embodiments, the wafer structure 30 may be rotated on its side such that peripheral edges of each of the wafers 10-1 to 10-3 are oriented up. The first cut lines 32 may be performed by mechanical sawing, laser cutting, or other singulation techniques. The first cut lines 32 may progress from top to bottom in a parallel manner to the edge of the rotated wafer structure 30. In this regard, planar slices 30-1 to 30-4 of the wafer structure 30 are separated and each planar slice 30-1 to 30-4 includes portions of each of the wafers 10-1 to 10-3. For illustrative purposes, four locations of the planar slices 30-1 to 30-4 are shown; however, the first cutting process may form any number of planar slices as it progresses down the wafer structure 30.

Figure 2D:
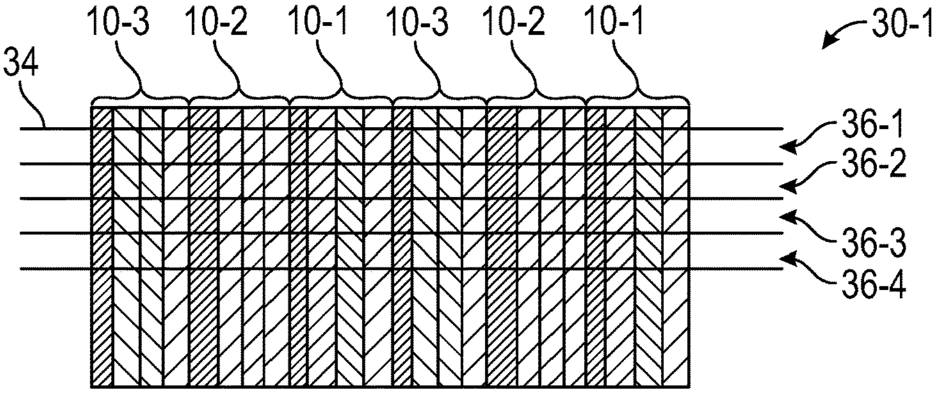
FIG. 2D is a top view of a planar slice separated from the wafer structure of FIG. 2D at a subsequent fabrication step where a second cutting process that traverses along second cut lines is performed.

FIG. 2D is a top view of the planar slice 30-1 or sheet from the wafer structure 30 of FIG. 2D at a subsequent fabrication step where a second cutting process that traverses along second cut lines 34 is performed. In FIG. 2D, the planar slice 30-1 is illustrated from a top view whereas the view of the planar slice 30-1 in FIG. 2C is from an edge thereof. As illustrated in FIG. 2D, the resulting planar slice 30-1 includes planar portions of each of the wafers 10-1 to 10-3. The second cut lines 34 progress across the planar slice 30-1 to define individual edge-emitting LED devices 36-1 to 36-4.

Figure 2E:
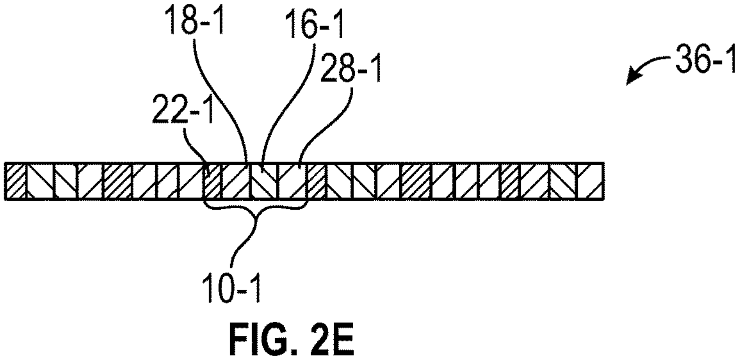
FIG. 2E is a top view of an edge-emitting LED chip separated from the planar slice of FIG. 2D.

FIG. 2E is a top view of the edge-emitting LED device 36-1 of FIG. 2D after singulation. The top view of FIG. 2E is from the perspective of a light-emitting edge of the LED device 36-1. As illustrated, the LED device 36-1 includes portions of each of the wafers 10-1 to 10-3 to provide multiple active LED structures. In this manner, light having multiple peak wavelengths of different colors may exit the LED device 36-1 along the top edge with emissions from each of the active LED structures from each of the wafers 10-1 to 10-3. For illustrative purposes, portions of the LED device 36-1 that are from one of the wafers 10-1 are labeled in FIG. 2E. Since the p-contact 22-1 and the n-contact 28-1 effectively sandwich the n-type layer 16-1 and the p-type layer 18-1, light generated therein may be reflected and redirected along the edge of the LED device 36-1. As illustrated, the LED device 36-1 may embody an elongated LED strip or ribbon with closely-spaced individual edge emitters. As such, the LED device 36-1 may be referred to as a multiple-color edge-emitting LED chip. In certain embodiments, the multiple color emitting regions from each wafer 10-1 to 10-3 may be electrically coupled in series in the LED device 36-1. In other embodiments, the LED device 36-1 as illustrated in FIG. 2E may further be subdivided into a number of individual edge-emitting LED chips that are not bonded together.

Figure 3A:
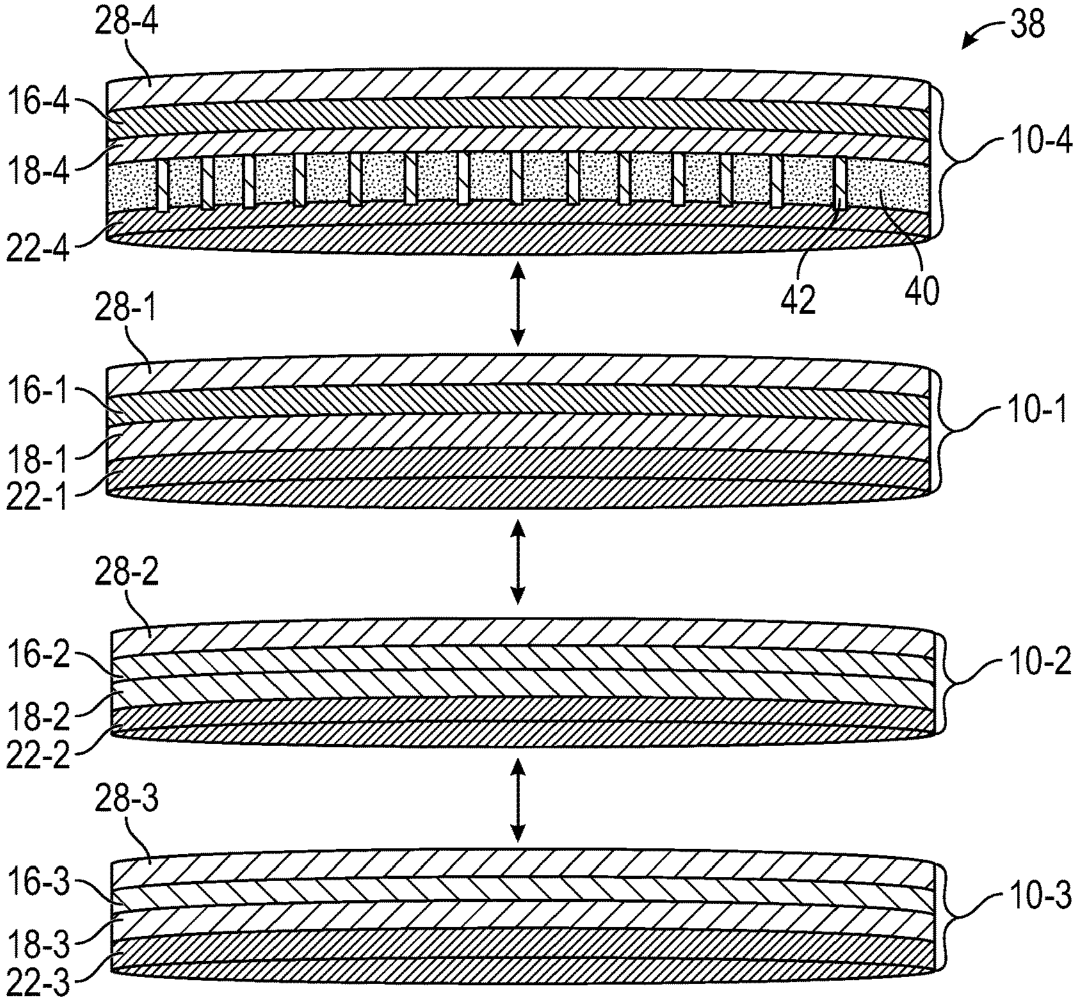
FIG. 3A is a perspective view at a fabrication step for a wafer structure that is similar to the wafer structure of FIGS. 2A to 2E and further includes another wafer that includes a wavelength conversion element.

FIG. 3A is a perspective view at a fabrication step for a wafer structure 38 that is similar to the wafer structure 30 of FIGS. 2A to 2E and further includes another wafer 10-4 that includes a wavelength conversion element 40. The wafer 10-4 may be similar to the wafer 10-1 and further includes the wavelength conversion element 40. The wavelength conversion element 40 may comprise lumiphoric materials and/or particles, such as phosphors, quantum dots, and the like. In certain embodiments, the wavelength conversion element 40 comprises lumiphoric particles suspended within a binder. Exemplary arrangements of the wavelength conversion element 40 include phosphor-in-glass structures, ceramic phosphor plates, or lumiphoric particles in a hardened binder of silicone or epoxy. As illustrated, the wavelength conversion element 40 may be positioned between the n-contact 28-4 and the p-contact 22-4. In this regard, light generated within the wafer 10-4 that is reflected between the n-contact 28-4 and the p-contact 22-4 may be subject to some wavelength conversion before exiting. In such arrangements, one or more electrically conductive vias 42 may be arranged through the wavelength conversion element 40 to provide electrically conductive paths to the n-type layer 16-4 or the p-type layer 18-4 of the wafer 10-4.

Figure 3B:
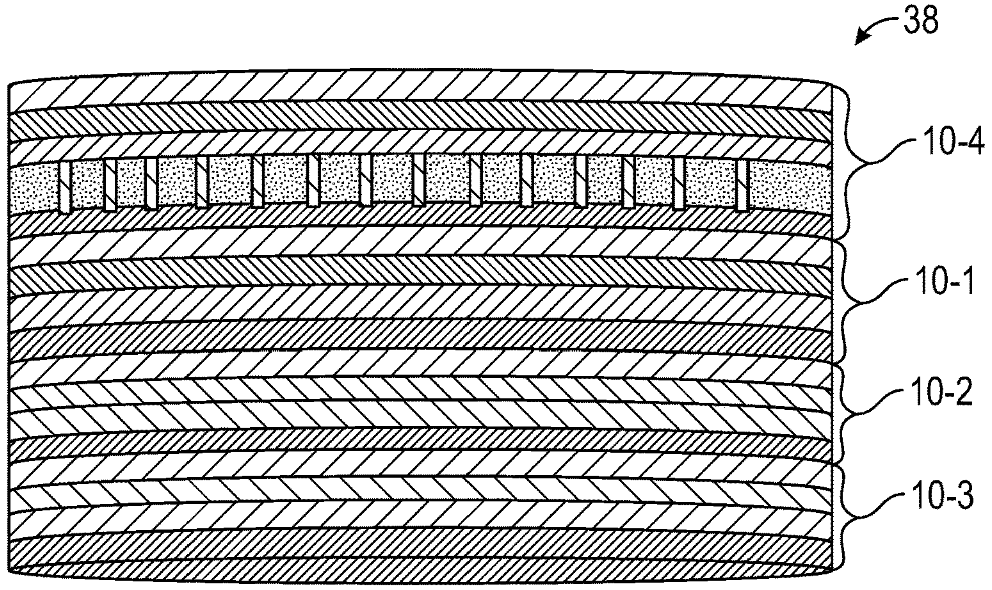
FIG. 3B is a perspective view of the wafer structure of FIG. 3A after the wafers are joined together.

FIG. 3B is a perspective view of the wafer structure 38 of FIG. 3A after the wafers 10-1 to 10-4 are joined together. The wafers 10-1 to 10-4 may be joined by temporary bonding materials or by more permanent bonding as described above for FIG. 2B. In certain embodiments, the bonding materials may provide electrical isolation between the wafers 10-1 to 10-4 or a separate insulator material may be provided between each of the wafers 10-1 to 10-4. The wafer structure 38 may then follow the fabrication sequence described above for FIGS. 2C to 2E to provide individual edge-emitting devices with one or more integrated wavelength conversion elements 40.

Figure 4A:
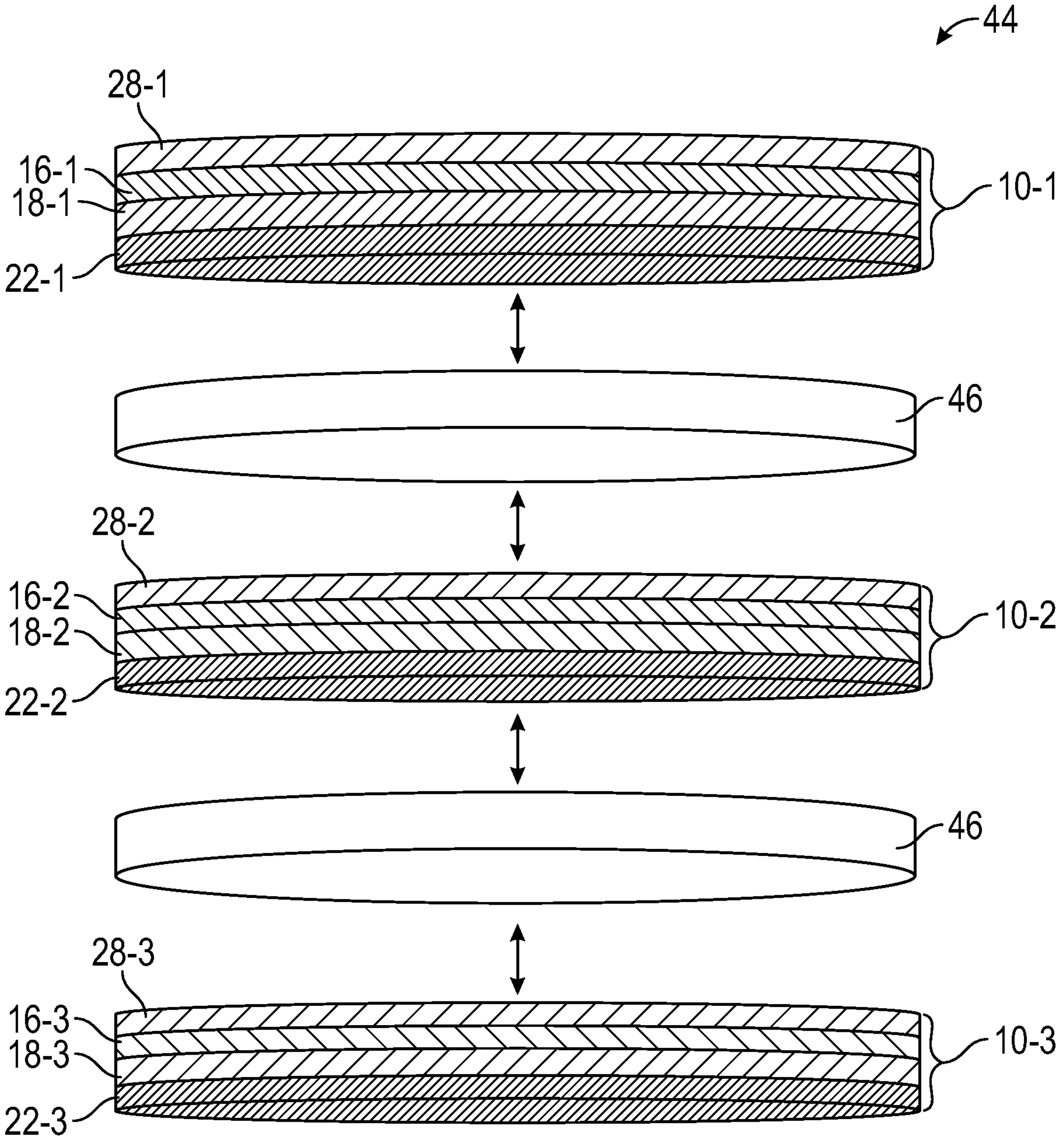
FIG. 4A is a perspective view at a fabrication step for a wafer structure that is similar to the wafer structure of FIGS. 2A to 2E for embodiments that include a bonding material between each of the wafers.

FIG. 4A is a perspective view at a fabrication step for a wafer structure 44 that is similar to the wafer structure 30 of FIGS. 2A to 2E for embodiments that include a bonding material 46 between each of the wafers 10-1 to 10-3. The principles described relative to the bonding material 46 are equally applicable to the wafer structure 38 of FIGS. 3A and 3B. As illustrated in FIG. 4, the bonding material 46 may be arranged to facilitate joining the wafers 10-1 to 10-3 together. As described above, the bonding material 46 may comprise temporary bonding materials, such as glue and/or wax materials, or more permanent bonding materials, such as epoxy or BCB bonding. The bonding material 46 may also comprise various dielectric materials, such as silicon dioxide ($SiO_2$), aluminum oxide ($Al_2O_3$), and/or silicon nitride (SiN), particularly for embodiments where electrical isolation between active LED structures of each of the wafers 10-1 to 10-3 is needed in final device structures. The wafer structure 44 may then follow the fabrication sequence described above for FIGS. 2B to 2E. Accordingly, individual edge-emitting devices may be provided with one or more bonding materials 46 separating portions of each of the wafers 10-1 to 10-3 present in the individual edge-emitting devices.

Figure 4B:
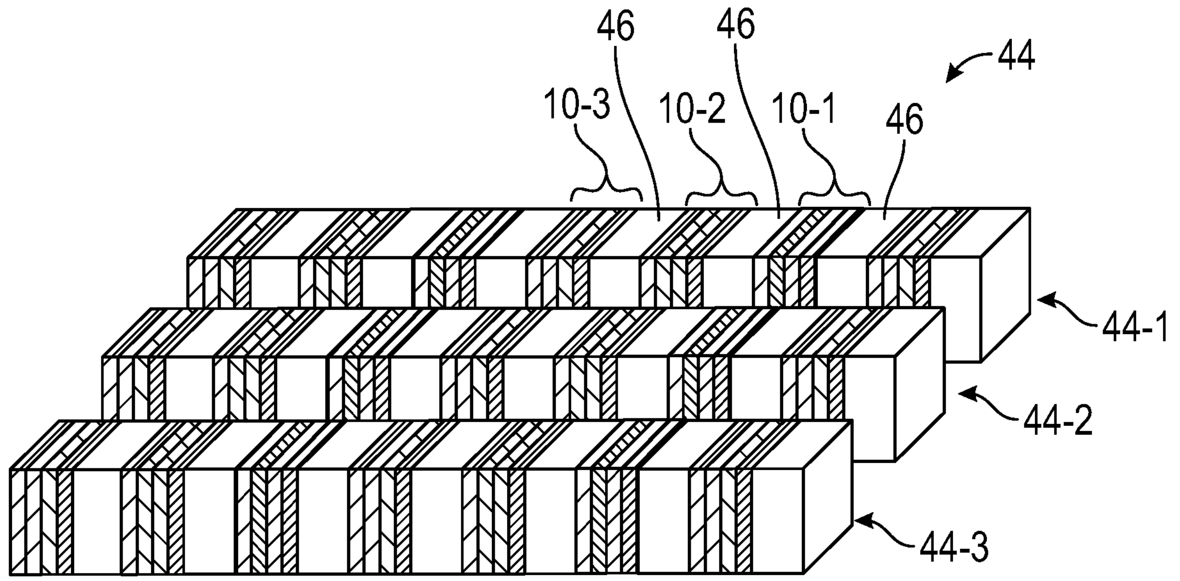
FIG. 4B is a perspective view of the wafer structure of FIG. 4A after several LED strips or ribbons of the wafer structure have been singulated.

FIG. 4B is a perspective view of the wafer structure 44 of FIG. 4A after several LED strips 44-1 to 44-3 of the wafer structure 44 have been singulated. Each LED strip 44-1 to 44-3 comprises portions of each of the wafers 10-1 to 10-3 separated by a portion of the bonding material 46. As used herein, the LED strips 44-1 to 44-3 may also be referred to as LED ribbons. For embodiments, where the bonding material 46 comprises temporary bonds, the bonding material 46 may readily be released to further singulate the portions of the wafers 10-1 to 10-3. For example, the bonding material 46 may comprise a glue or wax material that is readily dissolved after the LED strips 44-1 to 44-3 are formed.

Figure 4C:
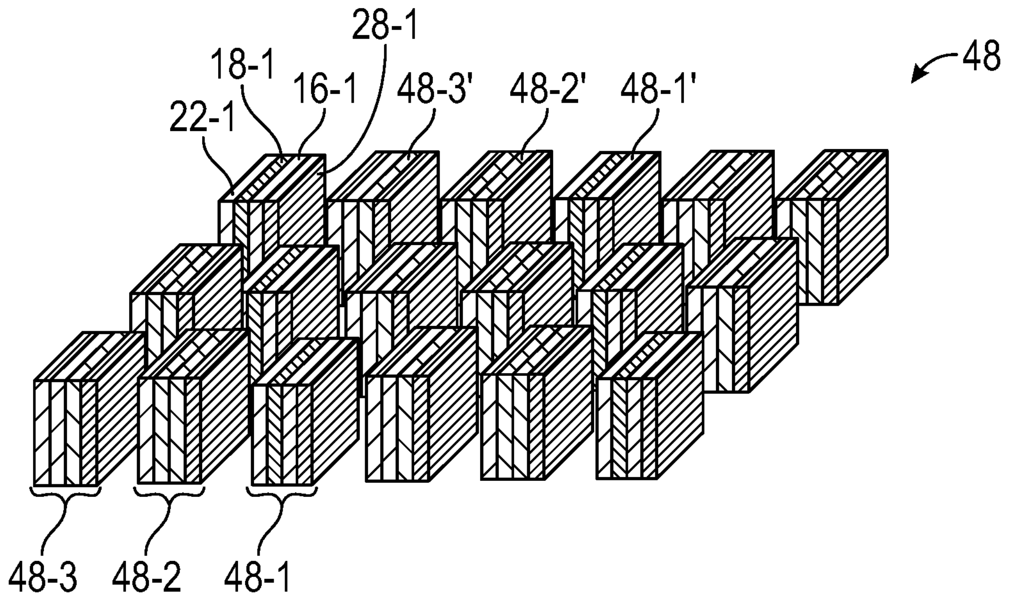
FIG. 4C is a perspective view of an LED array formed by removing the bonding material of FIG. 4B.

FIG. 4C is a perspective view of an LED array 48 formed by removing the bonding material 46 of FIG. 4B. In certain embodiments, the LED array 48 is formed by multiple LED chips 48-1 to 48-3 with a spacing and/or pitch determined by a thickness of the bonding material 46 of FIG. 4B. In other embodiments, the LED chips 48-1 to 48-3 may be rearranged as illustrated in FIG. 4C to avoid linear columns of same color LED chips 48-1 to 48-3 to improve light mixing and/or more readily form multiple color pixels. For exemplary pixel applications, each LED pixel may include a grouping of LED chips 48-1 to 48-3, each with a unique emission color. Each of the LED chips 48-1 to 48-3 respectively comprise portions of the wafers 10-1 to 10-3 of FIG. 4A. In FIG. 4C, one of the LED chips 48-1 is labeled to show the position of the n-type layer 16-1, the p-type layer 18-1, the n-contact 28-1, and the p-contact 22-1. For illustrative purposes, the active layer is not shown, although it is understood to be between the n-type layer 16 and the p-type layer 18 as illustrated above for FIG. 1A. In this manner, light generated within the LED chip 48-1 is reflected and/or redirected by the n-contact 28-1 and the p-contact 22-1 to provide edge emissions. In this regard, various edges 48-1' to 48-3' of the LED chips 48-1 to 48-3 include portions of the respective n-type layer 16-1 to 16-3, the p-type layer 18-1 to 18-3, and the active layer therebetween. Depending on the orientation, the edges 48-1' to 48-3' may embody mounting edges or light-emitting edges of the LED chips 48-1 to 48-3. By forming light-emitting edges with a portion of the active layer, at least some light generated by the active layer may exit the LED chip 48-1 without having to pass through other elements of the LED chip 48-1.

In certain embodiments, the n-contact 28-1 and the p-contact 22-2 may substantially cover portions of the n-type layer 16-1 and the p-type layer 18-1, such as covering at least 75%, or at least 90%, or at least 95% to 100%. The individual LED chips 48-1 to 48-3 of FIG. 4C may be implemented in a number of applications, separately or together as the LED array 48. For example, the LED chips 48-1 to 48-3 may embody separate edge-emitting devices that may be sorted and assembled in different LED packages and/or LED displays, among other applications. In other embodiments, the LED array 48, or portions thereof, may remain together with the pitch described above for use in a same LED package and/or display as further described below for FIGS. 4D and 4E.

Figure 4D:
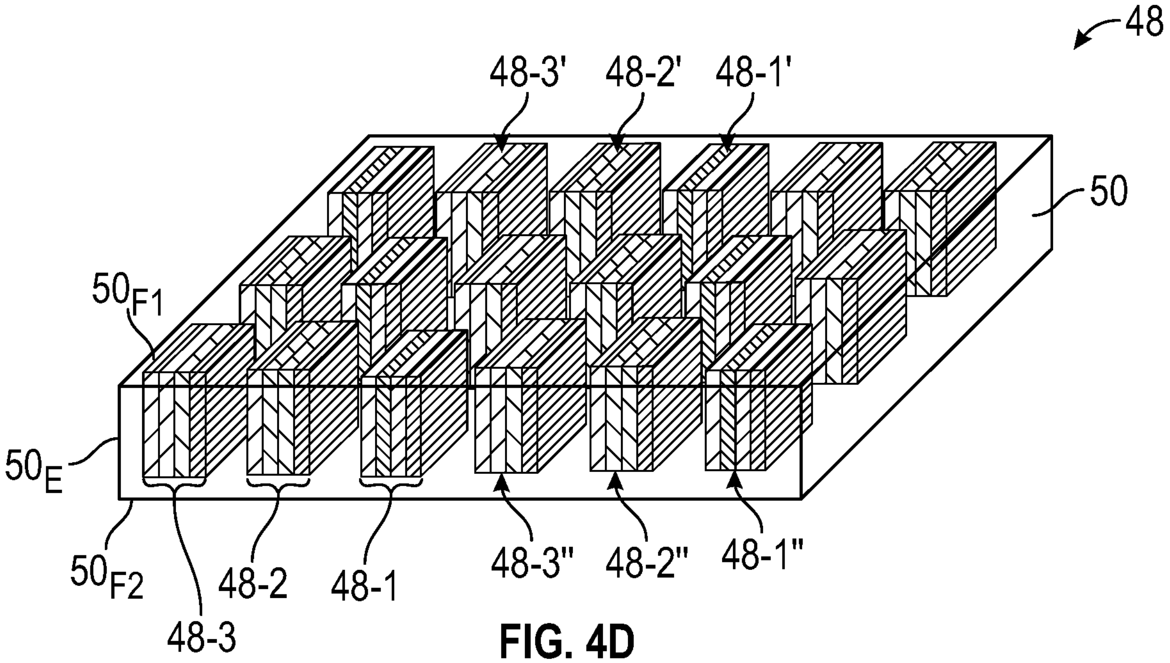
FIG. 4D is a perspective view of the LED array of FIG. 4C after an encapsulation layer is formed about each of the LED chips.

FIG. 4D is a perspective view of the LED array 48 of FIG. 4C after an encapsulation layer 50 is formed about each of the LED chips 48-1 to 48-3. The encapsulation layer 50 may embody a transparent matrix, such as silicone or epoxy, among others. In other embodiments, the encapsulation layer 50 may comprise light-altering materials, such as reflective materials for increased brightness and/or light-absorbing materials for increased contrast between the LED chips 48-1 to 48-3. In certain embodiments, the encapsulation layer 50 may be formed such that first edges 48-1' to 48-3' of each of the LED chips 48-1 to 48-3 are accessible. For example, the encapsulation layer 50 may be provided with a mold having a flat surface that covers each of the first edges 48-1' to 48-3'. In another example, the encapsulation layer 50 may initially cover the LED chips 48-1 to 48-3 before a removal process, such as planarization and/or polishing, is performed to expose the first edges 48-1' to 48-3'. As illustrated, the encapsulation layer 50 may form a first face $\mathbf{50}_{F1}$ and a second face $\mathbf{50}_{F2}$, with one or more edges 50E or sidewalls formed therebetween. In certain embodiments, the first edges 48-1' to 48-3' are proximate or even coplanar with the first face $\mathbf{50}_{F1}$ of the encapsulation layer 50. The encapsulation layer 50 may be formed with the LED array 48 supported by another surface, such as a mold housing or a releasable tape. In this manner, second edges 48-1" to 48-3" of the LED chips 48-1 to 48-3 may be proximate or even coplanar with the second face $\mathbf{50}_{F2}$ of the encapsulation layer 50.

Figure 4E:
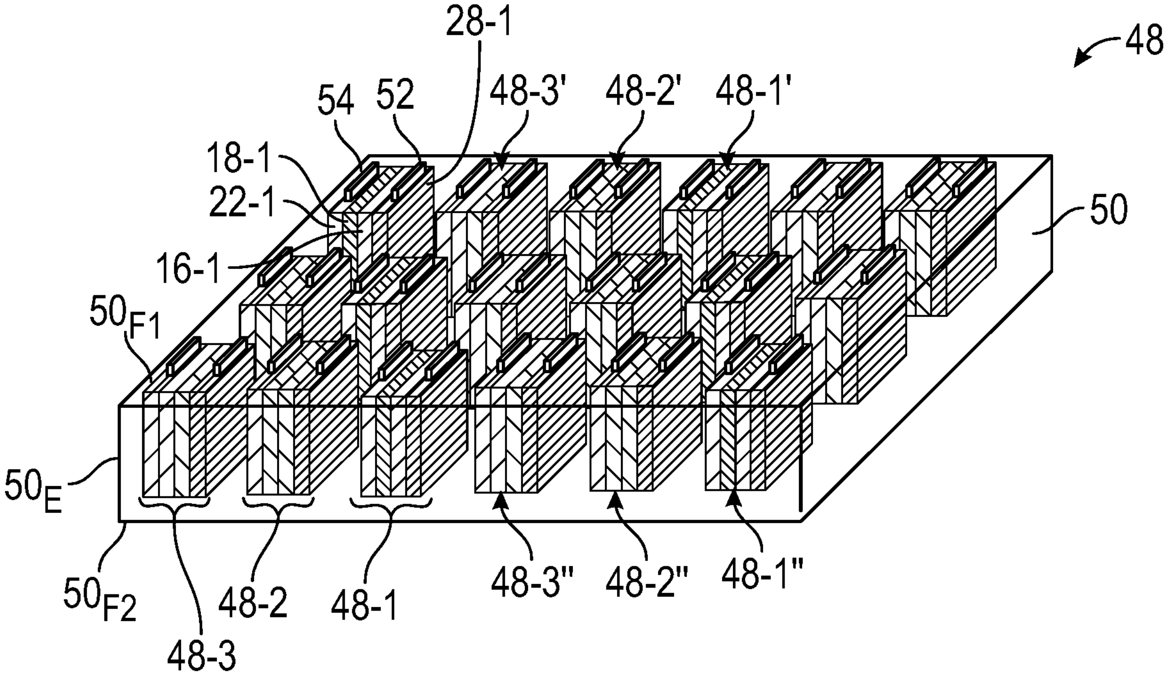
FIG. 4E is a perspective view of the LED array of FIG. 4D after an n-contact pad and a p-contact pad are formed on the LED chips.

FIG. 4E is a perspective view of the LED array 48 of FIG. 4D after an n-contact pad 52 and a p-contact pad 54 are formed on the LED chips 48-1 to 48-3. As illustrated the n-contact pad 52 and the p-contact pad 54 for each LED chip 48-1 to 48-3 may be formed on the first edges 48-1' to 48-3' that are accessible through the encapsulation layer 50. By way of example, the n-contact pad 52 is electrically coupled to a portion of the n-type layer 16-1 at the first edge 48-1' of the LED chip 48-1 and the p-contact pad 54 is electrically coupled to the p-type layer 18-1 at the first edge 48-1'. In this manner, the LED array 48 may be configured such that the first edges 48-1' to 48-3' and corresponding contact pads 52, 54 form a mounting surface that may be mounted to and electrically coupled to another surface, such as printed circuit board. In such an arrangement, second edges 48-1" to 48-3" of the LED chips 48-1 to 48-3 are formed opposite the first edges 48-1' to 48-3', and the second edges 48-1" to 48-3" form light-emitting edges for the LED array 48. In certain embodiments, the n-contact pads 52 and the p-contact pads 54 may be formed by lithography techniques. In other embodiments, the n-contact pads 52 and the p-contact pads 54 may be formed by electroplating. As illustrated, the LED chips 48-1 to 48-3 are vertically arranged such that a long axis (e.g., a length measured from the first edges 48-1' to 48-3' to the second edges 48-1" to 48-3") of each of the LED chips 48-1 to 48-3 is vertically arranged relative to the first face $50_{F1}$ and the second fact $50_{F2}$. In this manner, a short axis (e.g., a length measured between opposing surfaces that bound the first edges 48-1' to 48-3' and the second edges 48-1" to 48-3") of each of the LED chips 48-1 to 48-3 is horizontally arranged relative the first face $50_{F1}$ and the second fact $50_{F2}$. Stated differently, the active layer within each of the LED chips 48-1 to 48-3 may extend in a perpendicular direction between the first face $50_{F1}$ and the second fact $50_{F2}$.

Figure 4F:
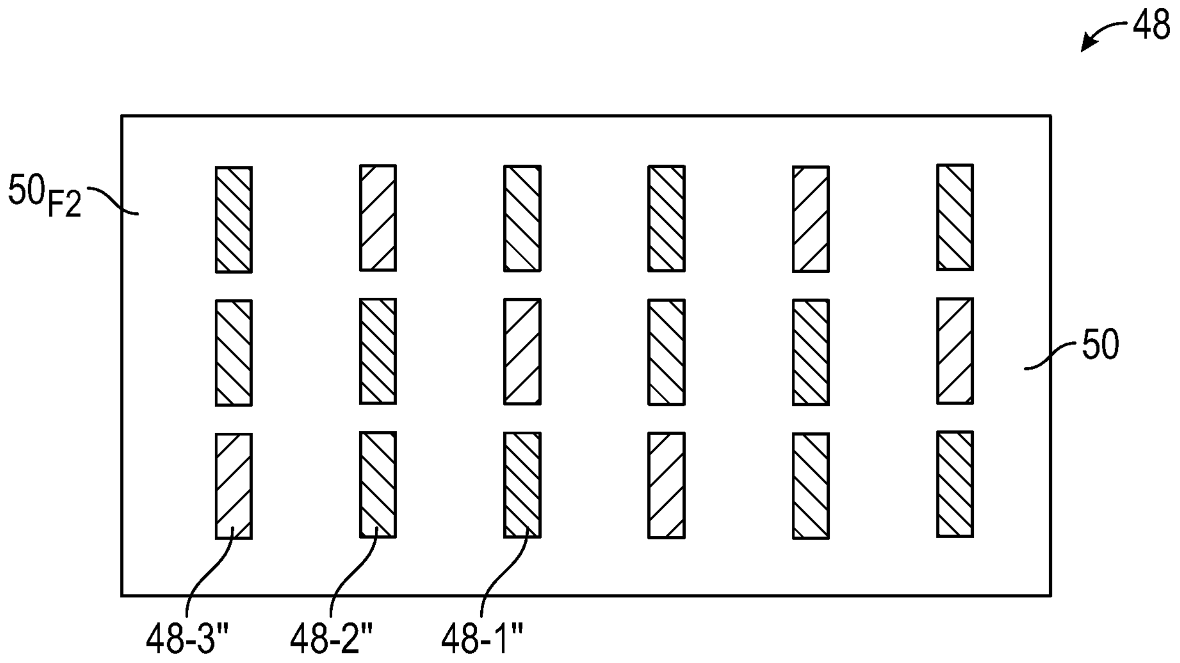
FIG. 4F is a top view of the LED array of FIG. 4E.

FIG. 4F is a top view of the LED array 48 of FIG. 4E after rotating the LED array 48 of FIG. 4E such that the contact pads 52, 54 are oriented for mounting. As illustrated, the second edges 48-1" to 48-3" form light-emitting edges of the LED array 48 that provide light in a desired emission direction. A pitch and/or spacing between adjacent pairs of the light-emitting edges 48-1" to 48-3" may be controlled to have a super fine pitch, for example as low as 10 nm, or in a range from 10 nm to 1000 nm with tolerances of + or −10%. As described above, the encapsulation layer 50 may be substantially transparent to wavelengths generated by the LED array 48. In other embodiments, the encapsulation layer 50 may be formed of a reflective material, such as having a white color, for increased brightness. In still further embodiments, the encapsulation layer 50 may comprise a light-absorbing material for providing increased contrast for light exiting each of the second edges 48-1" to 48-3".

Figure 5:
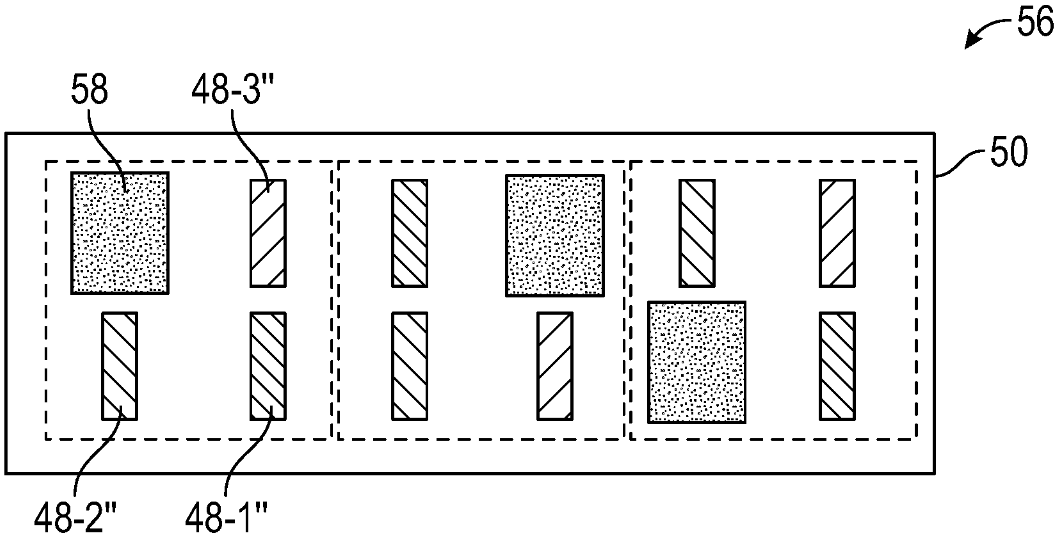
FIG. 5 is a top view of an LED array that is similar to the LED array of FIG. 4F for embodiments where a lumiphoric material is further applied over certain light-emitting edges of the LED array.

FIG. 5 is a top view of an LED array 56 that is similar to the LED array 48 of FIG. 4F for embodiments where a lumiphoric material 58 is further applied over certain light-emitting edges 48-1" to 48-3". The lumiphoric material 58 may be selectively applied over portions of the encapsulation layer 50 to cover certain ones of the light-emitting edges 48-1" to 48-3". By way of example, superimposed dashed lines are provided to delineate LED pixel groupings of the LED array 56. Each LED pixel may include red, green, blue, and white light-emitting regions where the white emissions are provided by a mixture of wavelength conversion from the lumiphoric material 58 and emissions from an underlying LED chip.

Figure 6:
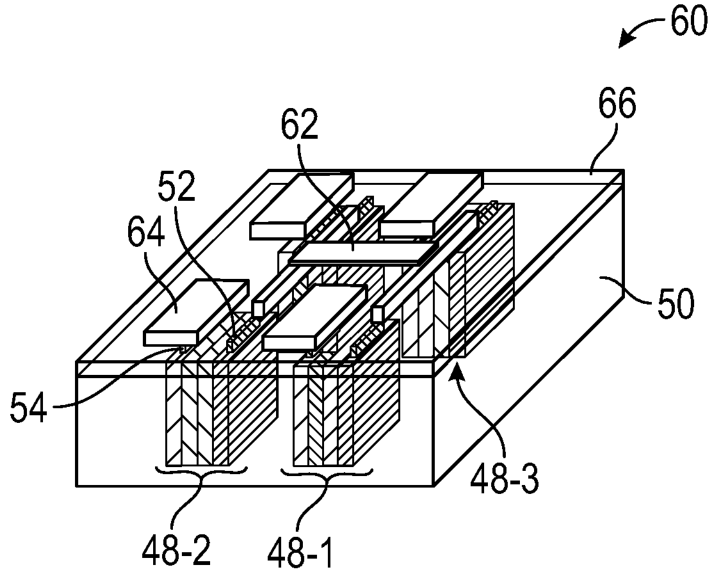
FIG. 6 is a perspective view of an LED pixel according to principles of the present disclosure.

FIG. 6 is a perspective view of an LED pixel 60 according to principles of the present disclosure. In certain embodiments, the LED pixel 60 may be singulated from a larger LED array, such as the LED array 48 of FIG. 4E. To facilitate various electrical connection schemes, additional contact pads 62 and 64 may be provided. The additional contact pads 62, 64 may be formed on an additional encapsulation layer 66. The additional encapsulation layer 66 may comprise any of the materials as described above for the encapsulation layer 50. The n-contact pads 52 and the p-contact pads 54 may extend through the additional encapsulation layer 66 to electrically couple with the additional contact pads 62, 64. In certain embodiments, the additional contact pads 62 and 64 may facilitate common anode or common cathode control for the LED chips 48-1 to 48-3 while having individually addressable control. For example, the contact pad 62 may be electrically coupled to each of the n-contact pads 52 while separate ones of the contact pads 64 may be electrically coupled to respective p-contact pads 54. In still further embodiments, each of the LED chips 48-1 to 48-3 may be provided with a separate pair of the additional contact pads 62, 64. In certain embodiments, the additional contact pads 62, 64 may have a larger surface area than the underlying n-contact pads 52 and p-contact pads 54 to facilitate improved mounting to another surface.

Figure 7:
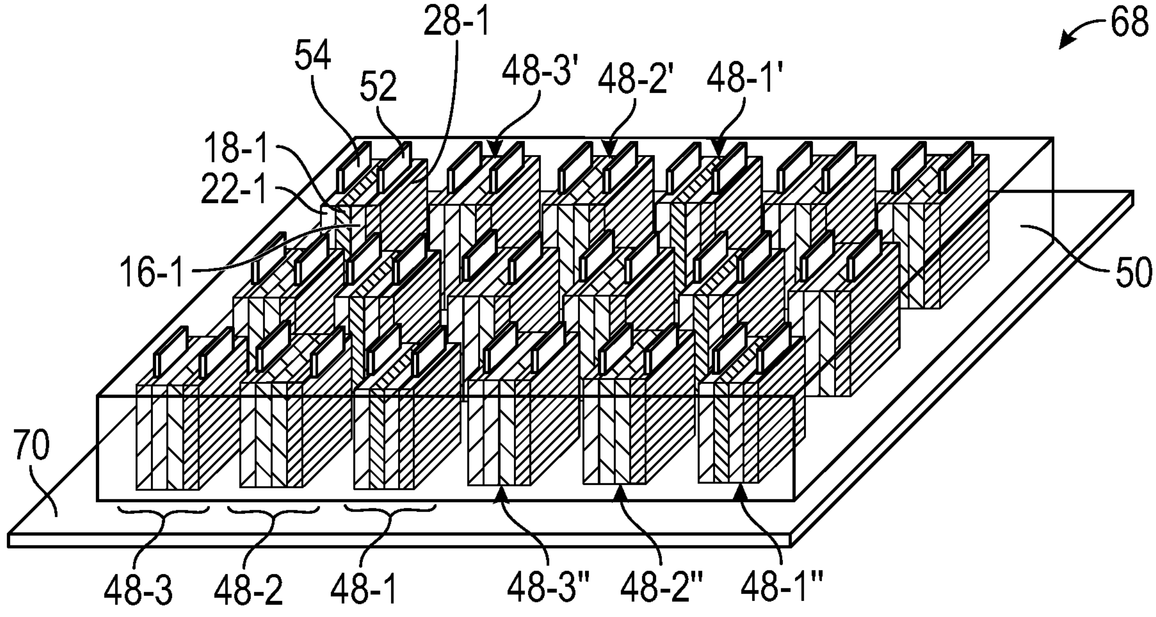
FIG. 7 is a perspective view of an LED array that is similar to the LED array at the fabrication step of FIG. 4E where the n-contact pads and the p-contact pads are formed by electroplating.

FIG. 7 is a perspective view of an LED array 68 that is similar to the LED array 48 at the fabrication step of FIG. 4E. FIG. 7 illustrates an embodiment where the n-contact pads 52 and the p-contact pads 54 are formed by electroplating. For example, the LED array 68 may be positioned on a bottom electrode 70 so the n-contact pads 52 and the p-contact pads 54 may be electroplated in place. By way of example for the LED chip 48-1, the n-contact pad 52 will be preferentially formed on the exposed portion of the n-contact 28-1 at the first edge 48-1' while the p-contact pad 54 will be preferentially formed on the exposed portion of the p-contact 22-1 at the first edge 48-1'. By employing electroplating, increased precision may be provided in forming the n-contact pads 52 and the p-contact pads 54. For example, the n-contact pads 52 and the p-contact pads 54 may be formed with increased thicknesses, such as in a range from 2 microns (μm) to 100 μm. Such increased thicknesses may allow additional structures, such as the additional encapsulation layer 66 and associated additional contact pads 62, 64 of FIG. 6, to be formed with increased thickness.

FIGS. 8A to 8G are perspective views of a wafer 72 during various fabrication steps for embodiments where individual edge emitting regions are formed before final singulation. The wafer 72 of FIGS. 8A to 8G is otherwise similar to the wafer 10 of FIGS. 1A to 1F. The wafer 72 may be substituted for any of the wafers of previous embodiments, including FIGS. 2A to 2E, 3A to 3B, 4A to 4F, 5, 6, and 7.

Figure 8A:
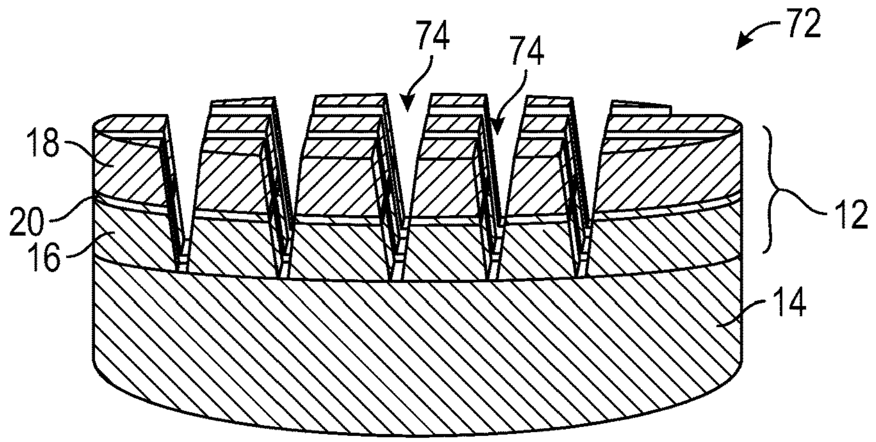
FIG. 8A is a perspective view of a wafer at a fabrication step similar to the wafer of FIGS. 1A to 1F where first openings are formed to electrically isolate individual regions of the active LED structure within the wafer.

FIG. 8A is a perspective view of the wafer 72 at a fabrication step where first openings 74 are formed through the p-type layer 18, the active layer 20, and the n-type layer 16 to electrically isolate individual regions of the active LED structure 12 within the wafer 72. The first openings 74 may be formed by a subtractive process, such as selective etching. In this manner, the electrically isolated individual regions of the active LED structure 12 form isolated LED junctions that are effectively pre-singulated within the wafer 72.

Figure 8B:
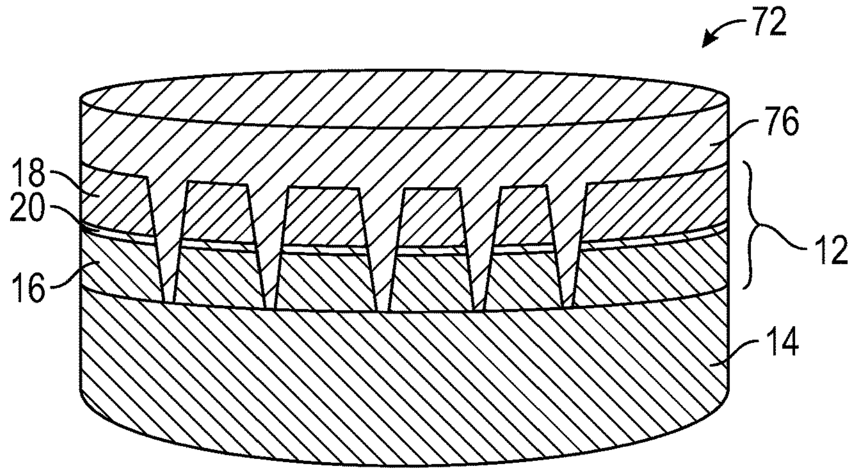
FIG. 8B is a perspective view of the wafer of FIG. 8A at a subsequent fabrication step where a passivation layer is formed to cover the p-type layer of the active LED structure and fill the first openings.

FIG. 8B is a perspective view of the wafer 72 of FIG. 8A at a subsequent fabrication step where a passivation layer 76 is formed to cover the p-type layer 18 and fill the first openings 74. The passivation layer 76 may comprise various dielectric materials, such as silicon nitride and/or silicon dioxide that passivate and electrically isolate mesa sidewalls of the active LED structure 12 within the first openings 74.

Figure 8C:
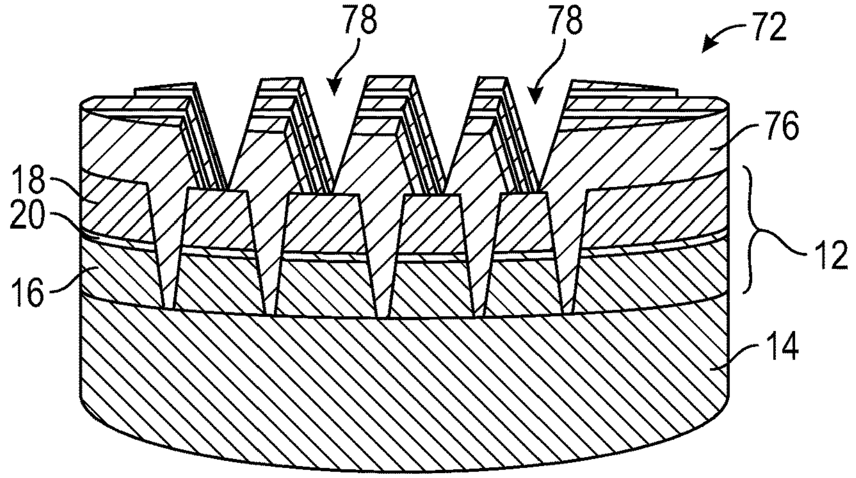
FIG. 8C is a perspective view of the wafer of FIG. 8B at a subsequent fabrication step after second openings are formed through portions of the passivation layer.

FIG. 8C is a perspective view of the wafer 72 of FIG. 8B at a subsequent fabrication step after second openings 78 are formed through portions of the passivation layer 76. The second openings 78 are arranged to expose portions of the p-type layer 18 at each of the isolated individual regions of the active LED structure 12.

Figure 8D:
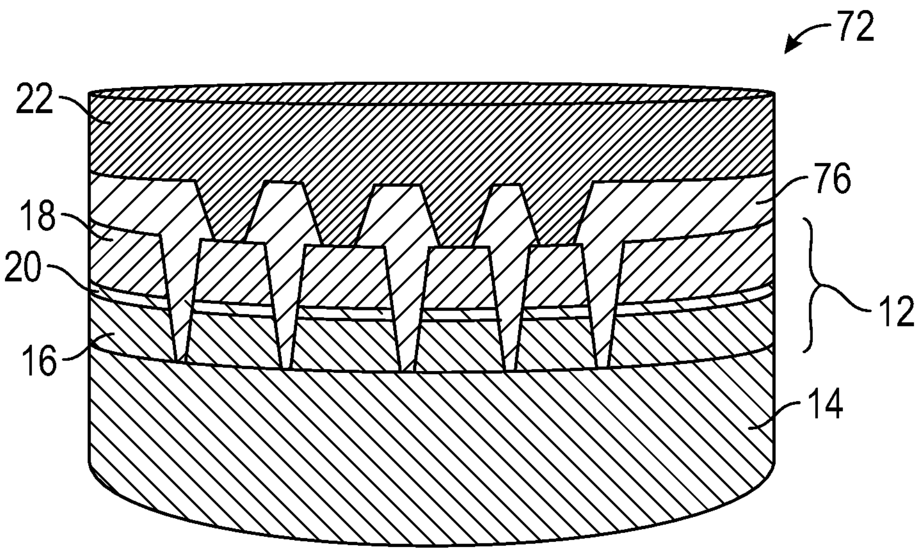
FIG. 8D is a perspective view of the wafer of FIG. 8C at a subsequent fabrication after the p-contact has been fabricated on the passivation layer and on portions of the p-type layer within the second openings.

FIG. 8D is a perspective view of the wafer 72 of FIG. 8C at a subsequent fabrication after the p-contact 22 has been fabricated on the passivation layer 76 and on portions of the p-type layer 18 within the second openings 78. The p-contact 22 may be formed in a similar manner and include similar materials as described above for FIG. 1B.

Figure 8E:
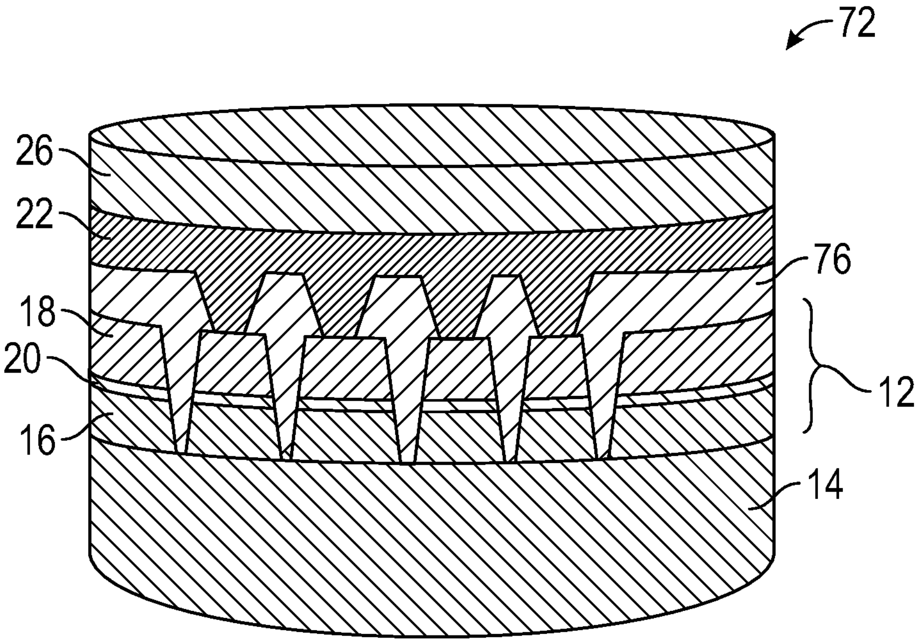
FIG. 8E is a perspective view of the wafer of FIG. 8D at a subsequent fabrication after the temporary carrier is bonded to the p-contact.

FIG. 8E is a perspective view of the wafer 72 of FIG. 8D at a subsequent fabrication after the temporary carrier 26 is bonded to the p-contact 22. The temporary carrier 26 may be formed in similar manner and include similar materials as described above for FIG. 1C.

Figure 8F:
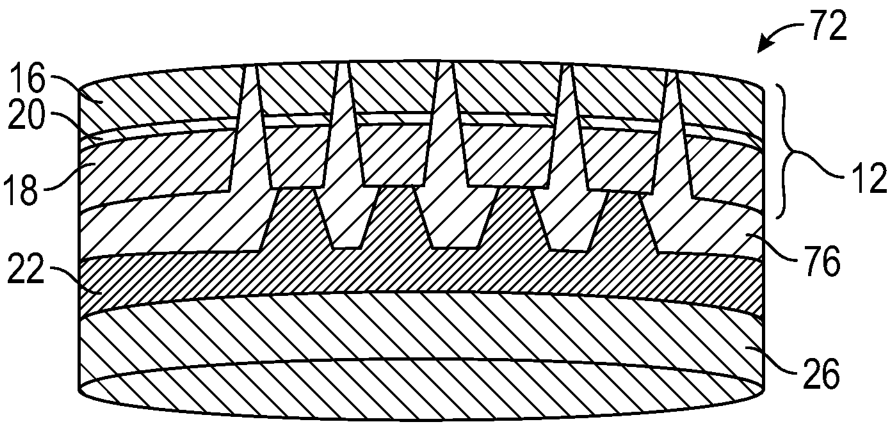
FIG. 8F is a perspective view of the wafer of FIG. 8E at a subsequent fabrication step after the growth substrate of FIG. 8E is removed.

FIG. 8F is a perspective view of the wafer 72 of FIG. 8E at a subsequent fabrication step after the growth substrate 14 of FIG. 8E is removed. The growth substrate 14 may be removed by various techniques, with laser liftoff being a suitable option. The surface of the n-type layer 16 that is exposed after the growth substrate 14 is removed may be subjected to cleaning step as described above for FIG. 1D.

Figure 8G:
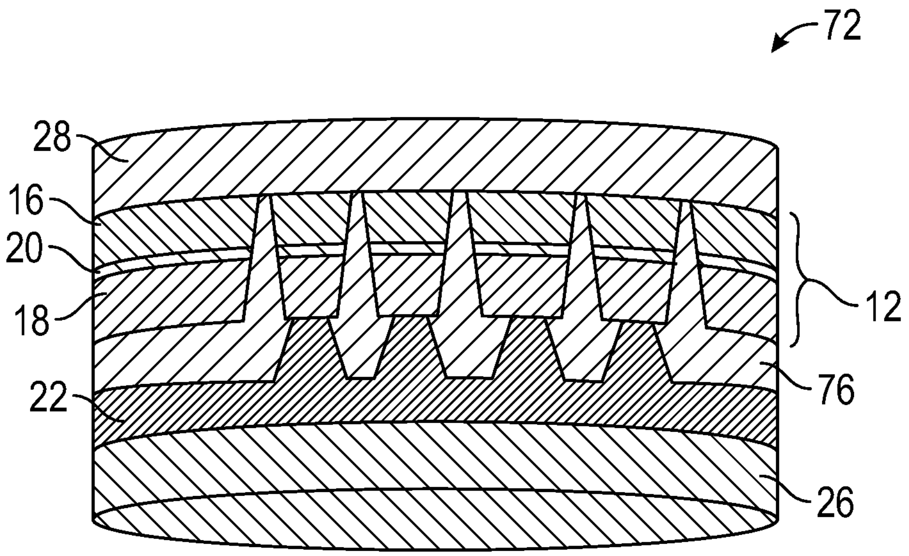
FIG. 8G is a perspective view of the wafer of FIG. 8F at a subsequent fabrication step after the n-contact has been fabricated on the n-type layer of the active LED structure.

FIG. 8G is a perspective view of the wafer 72 of FIG. 8F at a subsequent fabrication step after the n-contact 28 has been fabricated on the n-type layer 16. The n-contact 28 may be formed in a similar manner and include similar materials as described above for FIG. 1E. At this step, isolated individual LED regions of the active LED structure 12 each comprise portions of the n-type layer 16, the active layer 20, and the p-type layer 18, and all of the individual LED regions are sandwiched between the n-contact 28 and the p-contact 22. In certain embodiments, the temporary carrier 26 may then be removed in a similar manner as the described above for FIG. 1F.

The wafer 72 may then be implemented as one or more of the wafers 10-1 to 10-3 of FIGS. 2A to 2E or FIGS. 4A to 4F, 5, 6, and 7, or as one or more of the wafers 10-1 to 10-4 of FIGS. 3A to 3B. By pre-singulating the individual LED regions, damage associated with other singulation steps for forming singulated edge emitters may be reduced. In order to join multiple wafers 72 with such pre-singulated regions together, high accuracy wafer alignment tools may be utilized to provide precise alignment.

Figure 9:
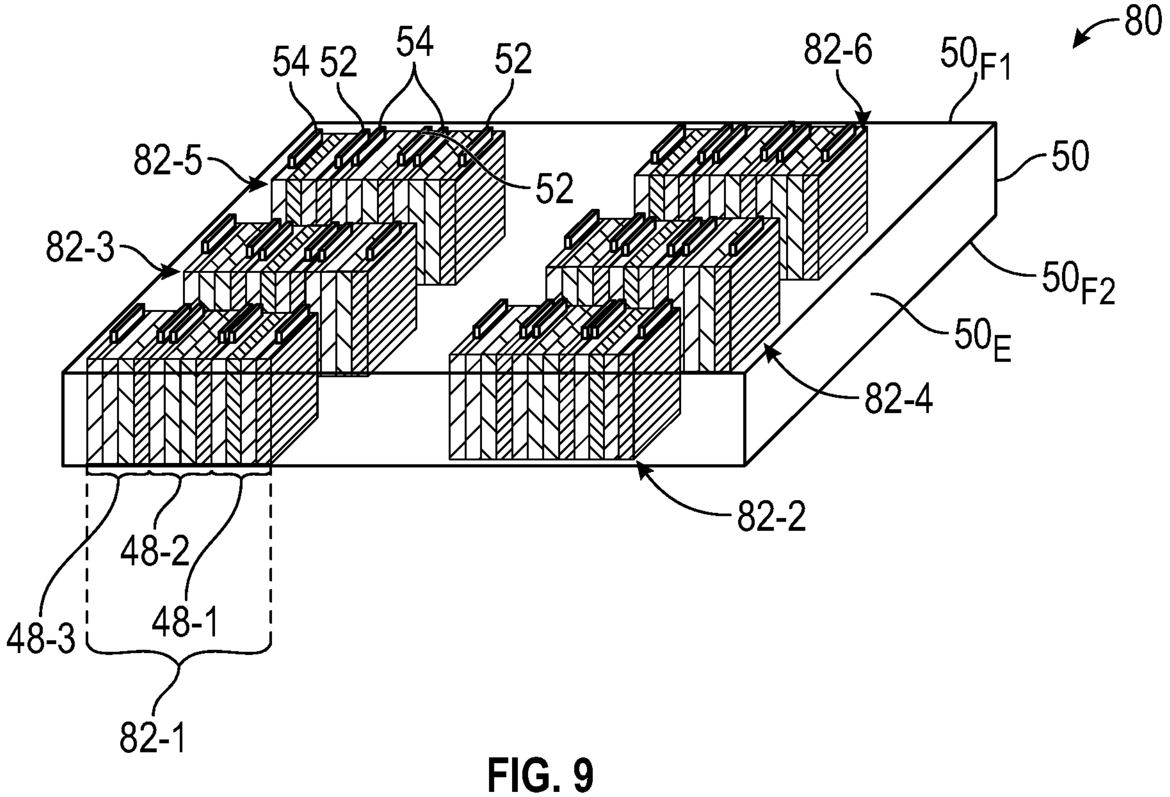
FIG. 9 is a perspective view of an LED array that is similar to the LED array of FIG. 4D for embodiments where LED devices are formed by subgroups of bonded LED chips.

FIG. 9 is a perspective view of an LED array 80 that is similar to the LED array 48 of FIG. 4D for embodiments where LED devices 82-1 to 82-6 are formed by subgroups of bonded LED chips 48-1 to 48-3. The LED array 80 may be formed in a similar manner as described above for the LED array 48, except each LED device 82-1 to 82-6 includes multiple LED chips 48-1 to 48-3 that are bonded together. For example, in the perspective view of FIG. 4B, the bonding material 46 may only be present between groupings of three wafers 10-1 to 10-3. That is, each grouping of three wafers 10-1 to 10-3 may be bonded together in a similar manner as the LED device 36-1 of FIG. 2E. In this regard, the LED devices 82-1 to 82-6 may embody LED ribbons spaced apart within the encapsulation layer 50. In certain embodiments, the LED devices 82-1 to 82-6 may be formed in a similar manner as the LED device 36-1 of FIG. 2E. The LED chips 48-1 to 48-3 may be electrically coupled in series within each LED device 82-1 to 82-6. In other embodiments, thin dielectric layers may be present between each of the LED chips 48-1 to 48-3 to provide individual addressability within each of the LED devices 82-1 to 82-6.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) array, comprising: an encapsulation layer; and a plurality of LED chips in the encapsulation layer, each LED chip of the plurality of LED chips comprising an active layer that extends in a perpendicular direction between a first face of the encapsulation layer and a second face of the encapsulation layer, wherein a first edge of each LED chip of the plurality of LED chips is proximate the first face of the encapsulation layer relative to the second face of the encapsulation layer, wherein electrical connections for the plurality of LED chips are electrically coupled to the first edge of each LED chip of the plurality of LED chips, and a second edge of each LED chip of the plurality of LED chips is positioned proximate the second face of the encapsulation layer relative to the first face of the encapsulation layer.

2. The LED array of claim 1, wherein the second edge of each LED chip of the plurality of LED chips forms a plurality of light-emitting edges for the plurality of LED chips.

3. The LED array of claim 2, further comprising a lumiphoric material on the first face of the encapsulation layer, the lumiphoric material being registered with the second edge of at least one LED chip of the plurality of LED chips.

4. The LED array of claim 1, wherein the first edge of each LED chip of the plurality of LED chips is coplanar with the first face of the encapsulation layer.

5. The LED array of claim 1, where the electrical connections comprise n-contact pads and p-contact pads on the first face of the encapsulation layer.

6. The LED array of claim 5, further comprising: an additional encapsulation layer on the first face of the encapsulation layer, wherein the n-contact pads and the p-contact pads extend through the additional encapsulation layer, and a plurality of additional contact pads on the additional encapsulation layer, wherein certain ones of the plurality of additional contact pads are electrically coupled to the certain ones of the n-contact pads or the p-contact pads.

7. The LED array of claim 6, wherein the plurality of additional contact pads comprise a larger surface area than the n-contact pads and the p-contact pads.

8. The LED array of claim 6, wherein a single additional contact pad of the plurality of additional contact pads is connected to multiple ones of either the n-contact pads or the p-contact pads.

9. The LED array of claim 1, wherein a pitch between adjacent LED chips of the plurality of LED chips is in a range from 10 nanometers (nm) to 1000 nm.

10. The LED array of claim 1, wherein the plurality of LED chips comprises subgroupings of LED chips bonded together to form LED devices that are spaced apart within the encapsulation layer.

11. The LED array of claim 10, wherein the LED chips within each of the subgroupings of LED chips are electrically connected in series.

12. A light-emitting diode (LED) device, comprising: a first active LED structure comprising a first n-type layer, a first active layer, and a first p-type layer, the first active LED structure forming a first edge that includes portions of the first n-type layer and the first p-type layer; a first n-contact pad electrically coupled to the first n-type layer at the first edge; a first p-contact pad electrically coupled to the first p-type layer at the first edge, and a second active LED structure with a second n-type layer, a second active layer, and a second p-type layer, the second active LED structure being arranged relative to the first active LED structure such that the first edge includes portions of the second n-type layer and the second p-type layer.

13. The LED device of claim 12, wherein the first active LED structure forms a second edge that is opposite the first edge, and the first active layer extends between the first edge and the second edge.

14. The LED device of claim 12, further comprising: a first n-contact layer on the first n-type layer; and a first p-contact layer on the first p-type layer, the first n-contact layer and the first p-contact layer both extending to the first edge on opposing sides of the first active LED structure.

15. The LED device of claim 14, further comprising: a second n-contact layer on the second n-type layer; and a second p-contact layer on the second p-type layer, wherein the first p-contact layer and the second n-contact layer are between the first active LED structure and the second active LED structure.

16. The LED device of claim 12, wherein the first active LED structure and the second active LED structure are electrically coupled in series.

17. The LED device of claim 14, further comprising a wavelength conversion element between the first n-contact layer and the first p-contact layer.

18. The LED device of claim 17, further comprising one or more electrically conductive vias that extend through the wavelength conversion element.

19. A light-emitting diode (LED) array, comprising: an encapsulation layer; and a plurality of LED chips in the encapsulation layer, each LED chip of the plurality of LED chips comprising an active layer that extends in a perpendicular direction between a first face of the encapsulation layer and a second face of the encapsulation layer, wherein a pitch between adjacent LED chips of the plurality of LED chips is in a range from 10 nanometers (nm) to 1000 nm.

20. The LED array of claim 19, wherein a first edge of each LED chip of the plurality of LED chips is proximate the first face of the encapsulation layer relative to the second face of the encapsulation layer, wherein electrical connections for the plurality of LED chips are electrically coupled to the first edge of each LED chip of the plurality of LED chips.

21. The LED array of claim 20, wherein a first edge of each LED chip of the plurality of LED chips is coplanar with the first face of the encapsulation layer.

22. The LED array of claim 20, wherein electrical connections for the plurality of LED chips comprise n-contact pads and p-contact pads on the first face of the encapsulation layer.

23. The LED array of claim 19, wherein the plurality of LED chips is configured to provide multiple peak wavelengths that are different from one another.

24. The LED array of claim 22, wherein the multiple peak wavelengths comprise a first peak wavelength in a range from 420 nm to 480 nm, a second peak wavelength in a range from 500 nm to 570 nm, and a third peak wavelength in a range from 600 nm to 700 nm.

* * * * *